(12) United States Patent
Augustine et al.

(10) Patent No.: US 12,037,918 B2
(45) Date of Patent: Jul. 16, 2024

(54) SYSTEMS AND METHODS FOR PARAMETERIZATION OF INSPECTED BLADED ROTOR ANALYSIS

(71) Applicant: RAYTHEON TECHNOLOGIES CORPORATION, Farmington, CT (US)

(72) Inventors: Scott J. Augustine, Wethersfield, CT (US); Elizabeth F. Vinson, Broad Brook, CT (US); Ron I. Prihar, West Hartford, CT (US); Uyen Phan, Arcadia, CA (US)

(73) Assignee: RTX CORPORATION, Farmington, CT (US)

( * ) Notice: Subject to any disclaimer, the term of this patent is extended or adjusted under 35 U.S.C. 154(b) by 93 days.

(21) Appl. No.: 17/845,656

(22) Filed: Jun. 21, 2022

(65) Prior Publication Data
US 2023/0313684 A1 Oct. 5, 2023

Related U.S. Application Data

(60) Provisional application No. 63/327,748, filed on Apr. 5, 2022.

(51) Int. Cl.
*F01D 5/00* (2006.01)
*B23P 6/00* (2006.01)
(Continued)

(52) U.S. Cl.
CPC .............. *F01D 5/005* (2013.01); *B23P 6/002* (2013.01); *G06F 30/15* (2020.01); *G06F 30/23* (2020.01); *F05D 2230/80* (2013.01)

(58) Field of Classification Search
CPC ...... F05D 2230/80; G06F 30/15; G06F 30/23; B23P 6/002; F01D 5/005; F01D 5/34
See application file for complete search history.

(56) References Cited

U.S. PATENT DOCUMENTS

| | | |
|---|---|---|
| 4,811,253 A | 3/1989 | Johns |
| 4,858,146 A | 8/1989 | Shebini |
| (Continued) | | |

FOREIGN PATENT DOCUMENTS

| | | |
|---|---|---|
| CA | 3173329 | 7/2021 |
| CN | 110362957 | 10/2019 |
| (Continued) | | |

OTHER PUBLICATIONS

European Patent Office, European Partial Search Report dated Aug. 14, 2023 in Application No. 23164760.3.
(Continued)

*Primary Examiner* — Moshe Wilensky
(74) *Attorney, Agent, or Firm* — SNELL & WILMER L.L.P.

(57) ABSTRACT

A method can comprise: receiving an inspection data corresponding to a geometry of an inspected bladed rotor; performing a baseline evaluation based on the inspection data; determining a plurality of candidate repair profiles for a defect of the inspected bladed rotor; performing an updated evaluation for each candidate repair profile in the plurality of candidate repair profiles; selecting a selected candidate repair profile in the plurality of candidate repair profiles based on the updated evaluation for each candidate repair profile in the plurality of candidate repair profiles; and performing a repair based on the selected candidate repair profile.

17 Claims, 12 Drawing Sheets

(51) Int. Cl.
G06F 30/15 (2020.01)
G06F 30/23 (2020.01)

(56) References Cited

U.S. PATENT DOCUMENTS

| | | | |
|---|---|---|---|
| 5,253,978 | A | 10/1993 | Fraser |
| 5,993,161 | A | 11/1999 | Shapiro et al. |
| 6,814,543 | B2 | 11/2004 | Barb et al. |
| 7,068,301 | B2 | 6/2006 | Thompson |
| 7,082,371 | B2 | 7/2006 | Griffin et al. |
| 8,045,144 | B2 | 10/2011 | Manfred |
| 8,255,170 | B2 | 8/2012 | Kollgaard et al. |
| 8,881,392 | B2 | 11/2014 | Derrien et al. |
| 9,036,892 | B2 | 5/2015 | Domke et al. |
| 9,477,224 | B2 | 10/2016 | Khan et al. |
| 9,739,167 | B2 | 8/2017 | Heinig et al. |
| 10,156,140 | B2 | 12/2018 | Walker et al. |
| 10,191,478 | B2 | 1/2019 | Georgeson et al. |
| 10,379,020 | B2 | 8/2019 | Sever et al. |
| 10,762,255 | B2 | 9/2020 | Feiner et al. |
| 11,434,764 | B2 | 9/2022 | Morris et al. |
| 2004/0148129 | A1 | 7/2004 | Gotoh et al. |
| 2004/0225474 | A1 | 11/2004 | Goldfine et al. |
| 2005/0033555 | A1 | 2/2005 | Tanner et al. |
| 2006/0073022 | A1 | 4/2006 | Gentile et al. |
| 2007/0005527 | A1 | 1/2007 | Parthasarathy |
| 2010/0064515 | A1 | 3/2010 | Eichmann et al. |
| 2011/0166798 | A1 | 7/2011 | Knodel et al. |
| 2013/0170947 | A1 | 7/2013 | Kurt-Elli et al. |
| 2014/0030092 | A1 | 1/2014 | Heining et al. |
| 2014/0100703 | A1 | 4/2014 | Dull et al. |
| 2014/0114587 | A1 | 4/2014 | Czerniak et al. |
| 2016/0246287 | A1 | 8/2016 | Modgil |
| 2017/0176342 | A1 | 6/2017 | Colletti |
| 2017/0370220 | A1 | 12/2017 | Morris et al. |
| 2020/0102827 | A1 | 4/2020 | Morris et al. |
| 2020/0159879 | A1 | 5/2020 | Feiner et al. |
| 2022/0100919 | A1 | 3/2022 | Chakrabarti et al. |

FOREIGN PATENT DOCUMENTS

| | | |
|---|---|---|
| EP | 2655005 | 10/2014 |
| EP | 3220119 | 9/2017 |
| EP | 2507009 | 11/2017 |
| EP | 3705726 | 9/2020 |
| WO | 20170192998 | 11/2017 |
| WO | 2020053778 | 3/2020 |
| WO | 2021150579 | 7/2021 |

OTHER PUBLICATIONS

European Patent Office, European Search Report dated Aug. 14, 2023 in Application No. 23164481.6.
European Patent Office, European Search Report dated Aug. 10, 2023 in Application No. 23164480.8.
European Patent Office, European Search Report dated Aug. 10, 2023 in Application No. 23164474.1.
European Patent Office, European Search Report dated Aug. 22, 2023 in Application No. 23166849.2.
European Patent Office, European Search Report dated Aug. 29, 2023 in Application No. 23166874.0.
Khemiri, et al.: "Asymtotic description of damping mistuning effects on the forced response of turbomachinery bladed disk", Journal of Sound and Vibration, vol. 332, No. 20, pp. 4998-5013, Dated May 20, 2013.
Ganine, et al: "A sparse preconditioned iterative method for vibration analysis of geometrically mistuned bladed disk", Computers and Structures, Pergamon Press, GB vol. 87, No. 5-6, pp. 342-354, dated Mar. 1, 2009.
Rodriguez, et al: "Analysis of expirimental results of turbomachinery fluttes using an asymptotic reduced order model", Journal of Sound and Vibration, Elsevier, Amsterdam, NL, vol. 509, 15 pages dated May 25, 2021.
Beck, et al. "Probabilistic Study of Intergrally Bladed Rotor Blends using Geometric Mistuning Models" 58th AIAA/ASCE/AHS/ASC Structures, Structural Dynamics, and Materials Confrence, 12 pages dated Jan. 5, 2017.
European Patent Office, European Search Report dated Aug. 29, 2023 in Application No. 23166868.2.
European Patent Office, European Search Report dated Aug. 14, 2023 in Application No. 23164852.8.
USPTO; Non-Final Office Action dated May 4, 2023 in U.S. Appl. No. 17/730,120.
USPTO; Notice of Allowance dated Sep. 1, 2023 in U.S. Appl. No. 17/730,120.
European Patent Office, European Search Report dated Aug. 22, 2023 in Application No. 23166856.7.
European Patent Office, European Search Report dated Aug. 29, 2023 in Application No. 23166872.4.
European Patent Office, European Search Report dated Aug. 22, 2023 in Application No. 23166863.3.
European Patent Office, European Search Report dated Aug. 29, 2023 in Application No. 23166864.1.
USPTO; Corrected Notice of Allowance dated Oct. 16, 2023 in U.S. Appl. No. 17/730,120.
European Patent Office, European Search Report dated Aug. 29, 2023 in Application No. 23164478.2.
Bai Bin et al: "Application of multi-stage multi-objective multi-disciplinary agent model based on dynamic substructural method in Mistuned Blisk", Aerospace Science and Technology, Elsevier Masson, FR, vol. 46, Jul. 8, 2015, pp. 104-115, DOI: 10.1016/J. AST.2015.06.030.
D'Souza Kiran et al: "Analyzing mistuned multi-stage turbomachinery rotors with aerodynamic effects", Journal of Fluids and Structures, Academic Press, Amsterdam, NL, vol. 42, Aug. 17, 2013, pp. 388-400, DOI: 10.1016/J.JFLUIDSTRUCTS.2013.07.007.
Nyssen F et al: "Experimental modal identification of mistuning in an academic two-stage drum", Mechanical Systems and Signal Processing, vol. 88, Nov. 14, 2016 (Nov. 14, 2016), pp. 428-444, DOI: 10.1016/J.YMSSP.2016.10.030.
European Patent Office, European Search Report dated Oct. 19, 2023 in Application No. 23176124.8.
USPTO; Corrected Notice of Allowance dated Nov. 9, 2023 in U.S. Appl. No. 17/730,120.
European Patent Office, European Search Report dated Nov. 14, 2023 in Application No. 23164760.3.

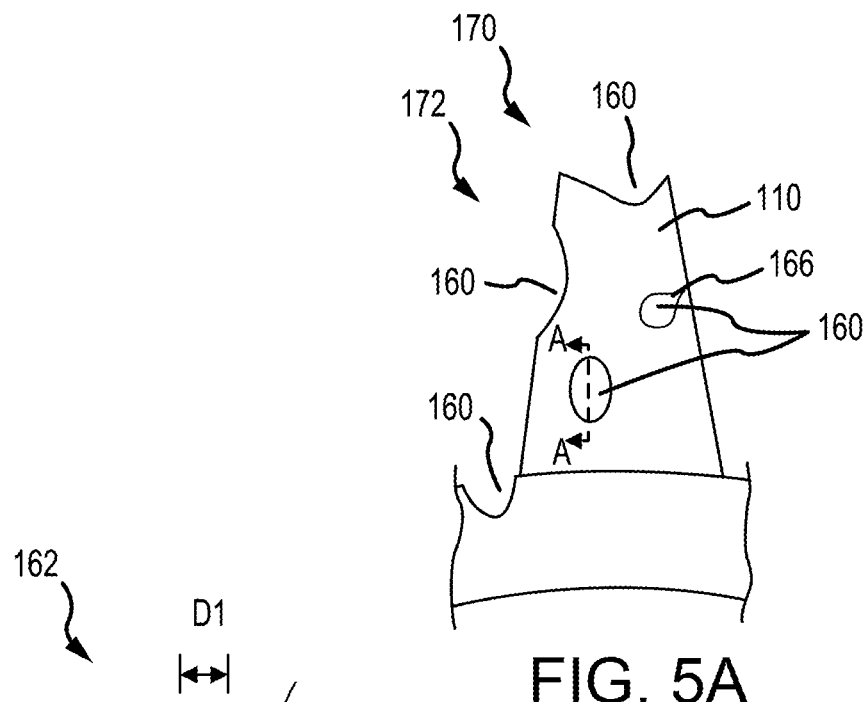
FIG. 5A
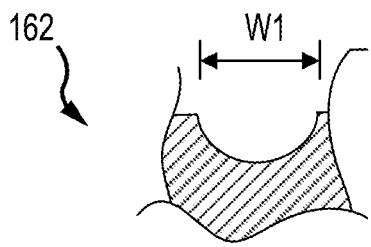
SECT B-B
FIG. 5C
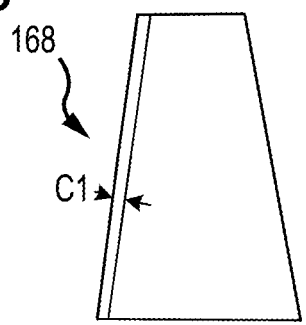
SECT A-A
FIG. 5B
FIG. 5D

SECT A-A

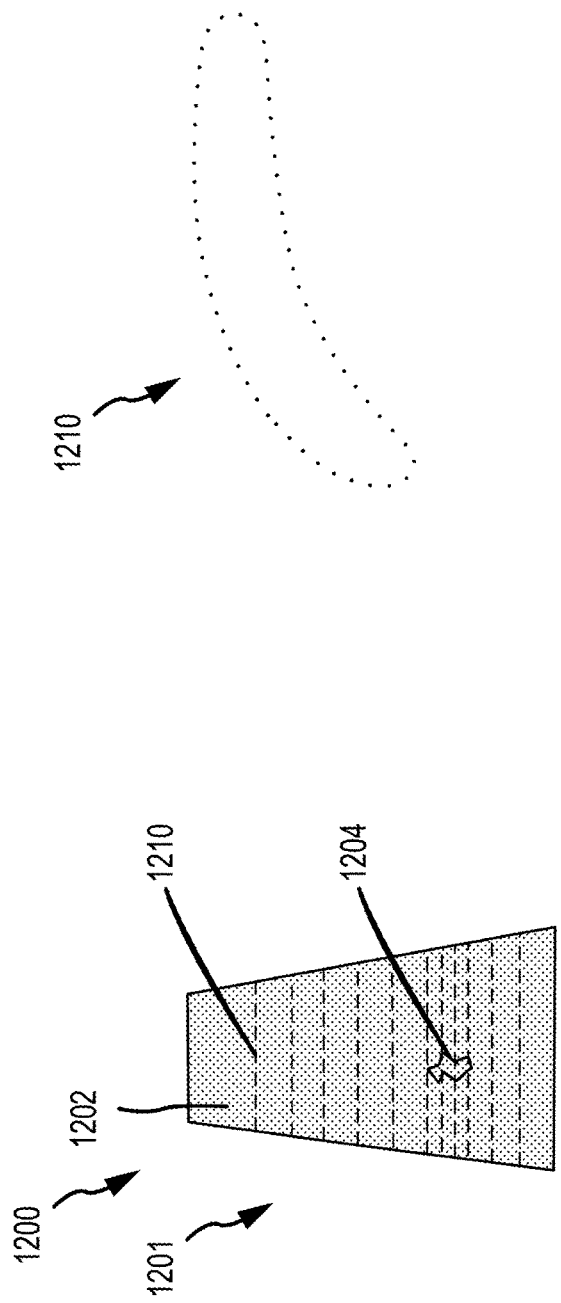
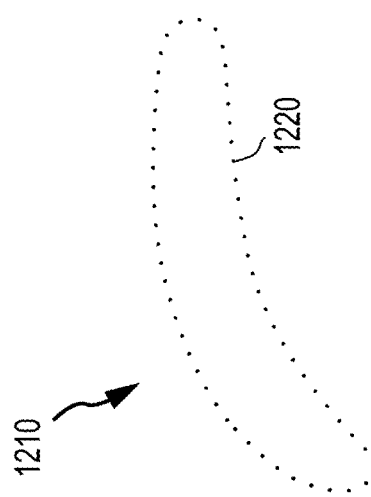
FIG. 12B
FIG. 12C
FIG. 12A

SYSTEMS AND METHODS FOR PARAMETERIZATION OF INSPECTED BLADED ROTOR ANALYSIS

CROSS-REFERENCE TO RELATED APPLICATIONS

This application is a non-provisional of, and claims priority to, and the benefit of U.S. Provisional Application No. 63/327,748, entitled "BLADED ROTOR INSPECTION, ANALYSIS AND REPAIR SYSTEMS AND METHODS," filed on Apr. 5, 2022, which is hereby incorporated by reference in its entirety.

FIELD

The present disclosure relates to repair analysis methods and systems, and more particularly, the repair analysis systems and methods for bladed rotors of gas turbine engines.

BACKGROUND

Gas turbine engines (such as those used in electrical power generation or used in modern aircraft) typically include a compressor, a combustor section, and a turbine. The compressor and the turbine typically include a series of alternating rotors and stators. A rotor generally comprises a rotor disk and a plurality of blades. The rotor may be an integrally bladed rotor ("IBR") or a mechanically bladed rotor.

The rotor disk and blades in the IBR are one piece (i.e., monolithic, or nearly monolithic) with the blades spaced around the circumference of the rotor disk. Conventional IBRs may be formed using a variety of technical methods including integral casting, machining from a solid billet, or by welding or bonding the blades to the rotor disk.

Repair methods for IBRs may be limited to maintaining the IBR within tolerances of a product definition for a design of the IBR, a volume or thickness of material addition, and/or a volume or thickness of material removal. Additionally, repair analysis methods for IBRs may fail to consider loads and/or boundary conditions encountered during engine operation included in the aerodynamic, structural, or other functional assessment of the IBR. In this regard, a damaged IBR may be scrapped because it is believed to unrepairable within the geometric assessment constraints (e.g., tolerances, material removal, material addition, etc.) without consideration of the functional assessment constraints (e.g., aerodynamic stability, structural durability, etc.). By being limited in this manner, less expensive repair options and/or more optimal repairs (e.g., in terms of aerodynamic or structural capability, etc.) that could otherwise be acceptable may be avoided.

SUMMARY

A method is disclosed herein. The method can comprise: receiving an inspection data corresponding to a geometry of an inspected bladed rotor; performing a baseline evaluation based on the inspection data; determining a plurality of candidate repair profiles for a defect of the inspected bladed rotor; performing an updated evaluation for each candidate repair profile in the plurality of candidate repair profiles; selecting a selected candidate repair profile in the plurality of candidate repair profiles based on the updated evaluation for each candidate repair profile in the plurality of candidate repair profiles; and performing a repair based on the selected candidate repair profile.

In various embodiments, the baseline evaluation and the updated evaluations include an engine performance evaluation, an engine operability evaluation, a module aerodynamic performance evaluation, and a structural evaluation. The method can further comprise balancing output parameters from the updated evaluations prior to selecting the selected candidate repair profile.

In various embodiments, the plurality of candidate repair profiles includes a repair blend profile and a repair patch profile.

In various embodiments, the selected candidate repair profile is selected based on an impact to a second inspected bladed rotor based on an output parameter from the updated evaluation.

In various embodiments, the baseline evaluation and the updated evaluation includes performing a modal analysis, a static analysis, a turning and loss change analysis, and an engine performance analysis.

In various embodiments, the baseline evaluation includes evaluating a digital representation based on the geometry and an initial repair blend profile.

An article of manufacture is disclosed herein. In various embodiments, the article of manufacture includes a tangible, non-transitory computer-readable storage medium having instructions stored thereon that, in response to execution by a processor, cause the processor to perform operations comprising: receiving, by the processor, a digital representation of a geometry of an inspected bladed rotor; receiving, by the processor, engine data from a gas turbine engine that had the inspected bladed rotor installed thereon; performing, by the processor, a baseline evaluation of the digital representation based on the digital representation, an initial repair shape, and the engine data; performing, by the processor, an updated evaluation for each candidate repair profile in a plurality of candidate repair profiles for the inspected bladed rotor; and generating, by the processor, results from the updated evaluation for each candidate repair profile.

In various embodiments, the operations further comprise receiving, by the processor, a candidate repair profile in the plurality of candidate repair profiles based on impacting the updated evaluation for a second inspected bladed rotor for a module level analysis.

In various embodiments, the baseline evaluation and the updated evaluations include an engine performance evaluation, an engine operability evaluation, a module aerodynamic performance evaluation, and a structural evaluation.

In various embodiments, the operations further comprise generating, by the processor, shape sensitivity data to a repair shape for the inspected bladed rotor.

In various embodiments, the operations further comprise determining, by the processor, whether the updated evaluation for each candidate repair profile in the plurality of candidate repair profiles meets an experience based criteria.

In various embodiments, the operations further comprise determining, by the processor, whether the updated evaluation for each candidate repair profile in the plurality of candidate repair profiles meets a deterministic criteria.

In various embodiments, the updated evaluation for each candidate repair profile in the plurality of candidate repair profiles includes a module level evaluation including a plurality of inspected bladed rotors.

A system is disclosed herein. In various embodiments, the system comprises: an inspection system configured to scan an inspected bladed rotor and generate a point cloud of at least a portion of the inspected bladed rotor; and an analysis system in electronic communication with the inspection system, the analysis system comprising a tangible, non-transitory computer-readable storage medium having instructions stored thereon that, in response to execution by a processor, cause the processor to perform operations comprising: receive, by the processor, a data set based on the point cloud; generate, by the processor, a digital representation of the inspected bladed rotor based on the data set; perform, by the processor, a baseline evaluation based on the digital representation; perform, by the processor, an updated evaluation for each candidate repair profile in a plurality of candidate repair profiles; and generate, by the processor, results from the updated evaluation for each candidate repair profile.

In various embodiments, the baseline evaluation and the updated evaluations include an engine performance evaluation, an engine operability evaluation, a module aerodynamic performance evaluation, and a structural evaluation.

In various embodiments, the operations further comprise receiving, by the processor, a candidate repair profile in the plurality of candidate repair profiles based on impacting the updated evaluation for a second inspected bladed rotor for a module level analysis.

In various embodiments, the operations further comprise generating, by the processor, shape sensitivity data to a repair shape for the inspected bladed rotor.

In various embodiments, the operations further comprise determining, by the processor, whether the updated evaluation for each candidate repair profile in the plurality of candidate repair profiles meets a deterministic criteria.

In various embodiments, the updated evaluation includes an aerodynamic simulation and a structural simulation.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

FIG. 5A illustrates a portion of a repaired bladed rotor, in accordance with various embodiments;

FIG. 5B illustrates a repair blend profile, in accordance with various embodiments;

FIG. 5C illustrates a repair blend profile, in accordance with various embodiments;

FIG. 5D illustrates a repair blend profile, in accordance with various embodiments;

FIG. 12A illustrates a point cloud of an inspected bladed rotor, in accordance with various embodiments;

FIG. 12B illustrates a section file of an inspected bladed rotor, in accordance with various embodiments; and FIG. 12C illustrates a section file of an inspected bladed rotor, in accordance with various embodiments.

DETAILED DESCRIPTION

The following detailed description of various embodiments herein refers to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an", or "the" may include one or more than one and that reference to an item in the singular may also include the item in the plural. Further, all ranges may include upper and lower values and all ranges and ratio limits disclosed herein may be combined.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

Figure 1A:
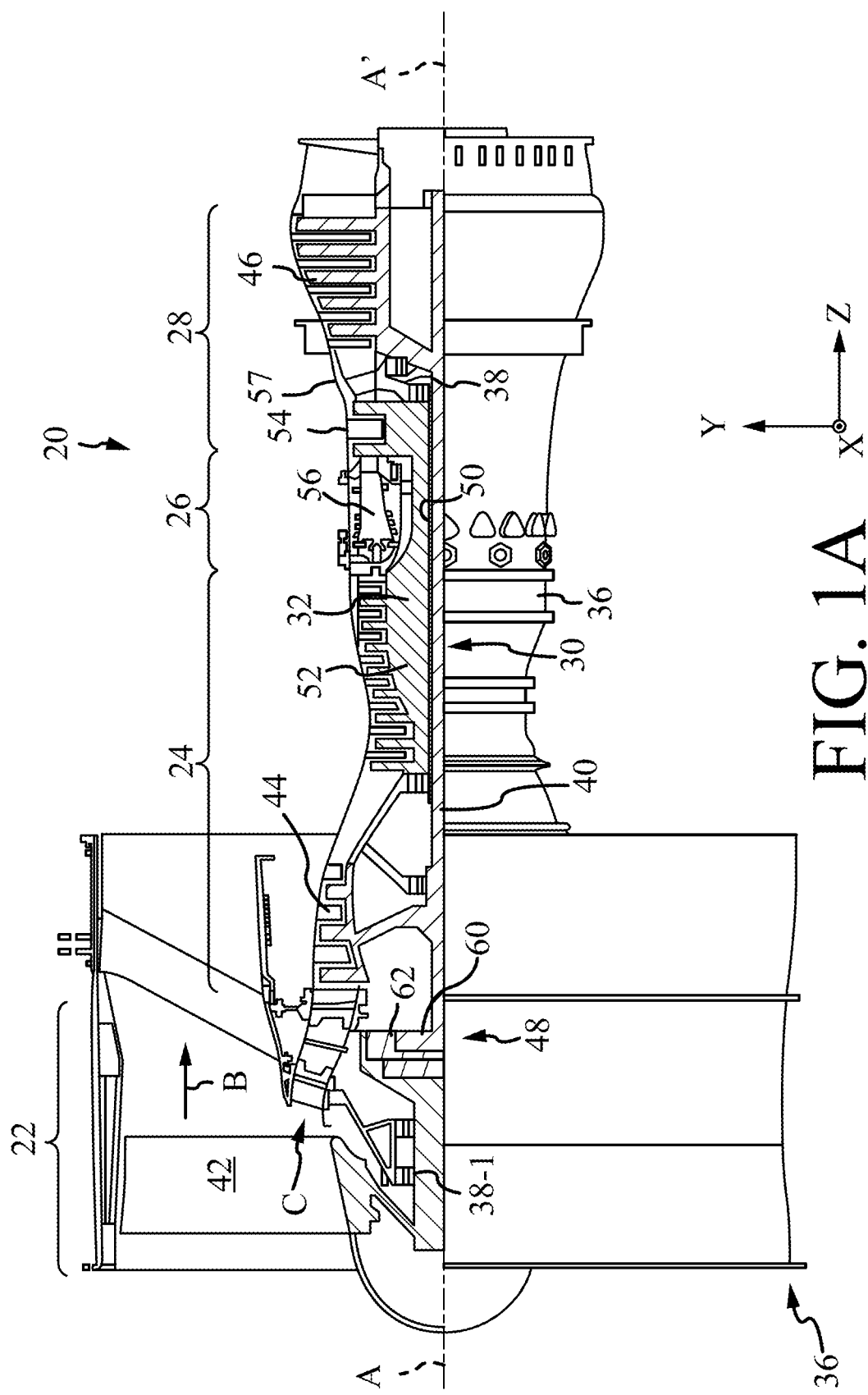
FIG. 1A illustrates a cross-sectional view of a gas-turbine engine, in accordance with various embodiments.

With reference to FIG. 1A, a gas turbine engine 20 is shown according to various embodiments. Gas turbine engine 20 may be a two-spool turbofan that generally incorporates a fan section 22, a compressor section 24, a combustor section 26, and a turbine section 28. In operation, fan section 22 can drive air along a path of bypass airflow B while compressor section 24 can drive air along a core flow path C for compression and communication into combustor section 26 then expansion through turbine section 28. Although depicted as a turbofan gas turbine engine 20 herein, it should be understood that the concepts described herein are not limited to use with turbofans as the teachings may be applied to other types of turbine engines including three-spool architectures, single spool architecture or the like.

Gas turbine engine 20 may generally comprise a low speed spool 30 and a high speed spool 32 mounted for rotation about an engine central longitudinal axis A-A' relative to an engine static structure 36 or engine case via several bearing systems 38, 38-1, etc. Engine central longitudinal axis A-A' is oriented in the Z direction on the provided X-Y-Z axes. It should be understood that various bearing systems 38 at various locations may alternatively or additionally be provided, including for example, bearing system 38, bearing system 38-1, etc.

Low speed spool 30 may generally comprise an inner shaft 40 that interconnects a fan 42, a low pressure compressor 44 and a low pressure turbine 46. Inner shaft 40 may be connected to fan 42 through a geared architecture 48 that can drive fan 42 at a lower speed than low speed spool 30. Geared architecture 48 may comprise a gear assembly 60 enclosed within a gear housing 62. Gear assembly 60 couples' inner shaft 40 to a rotating fan structure. High speed spool 32 may comprise an outer shaft 50 that interconnects a high pressure compressor 52 and high pressure turbine 54. A combustor 56 may be located between high pressure compressor 52 and high pressure turbine 54. A mid-turbine frame 57 of engine static structure 36 may be located generally between high pressure turbine 54 and low pressure turbine 46. Mid-turbine frame 57 may support one or more bearing systems 38 in turbine section 28. Inner shaft 40 and outer shaft 50 may be concentric and rotate via bearing systems 38 about the engine central longitudinal axis A-A', which is collinear with their longitudinal axes. As used herein, a "high pressure" compressor or turbine experiences a higher pressure than a corresponding "low pressure" compressor or turbine.

The core airflow may be compressed by low pressure compressor 44 then high pressure compressor 52, mixed and burned with fuel in combustor 56, then expanded over high pressure turbine 54 and low pressure turbine 46. Turbines 46, 54 rotationally drive the respective low speed spool 30 and high speed spool 32 in response to the expansion.

Figure 1B:
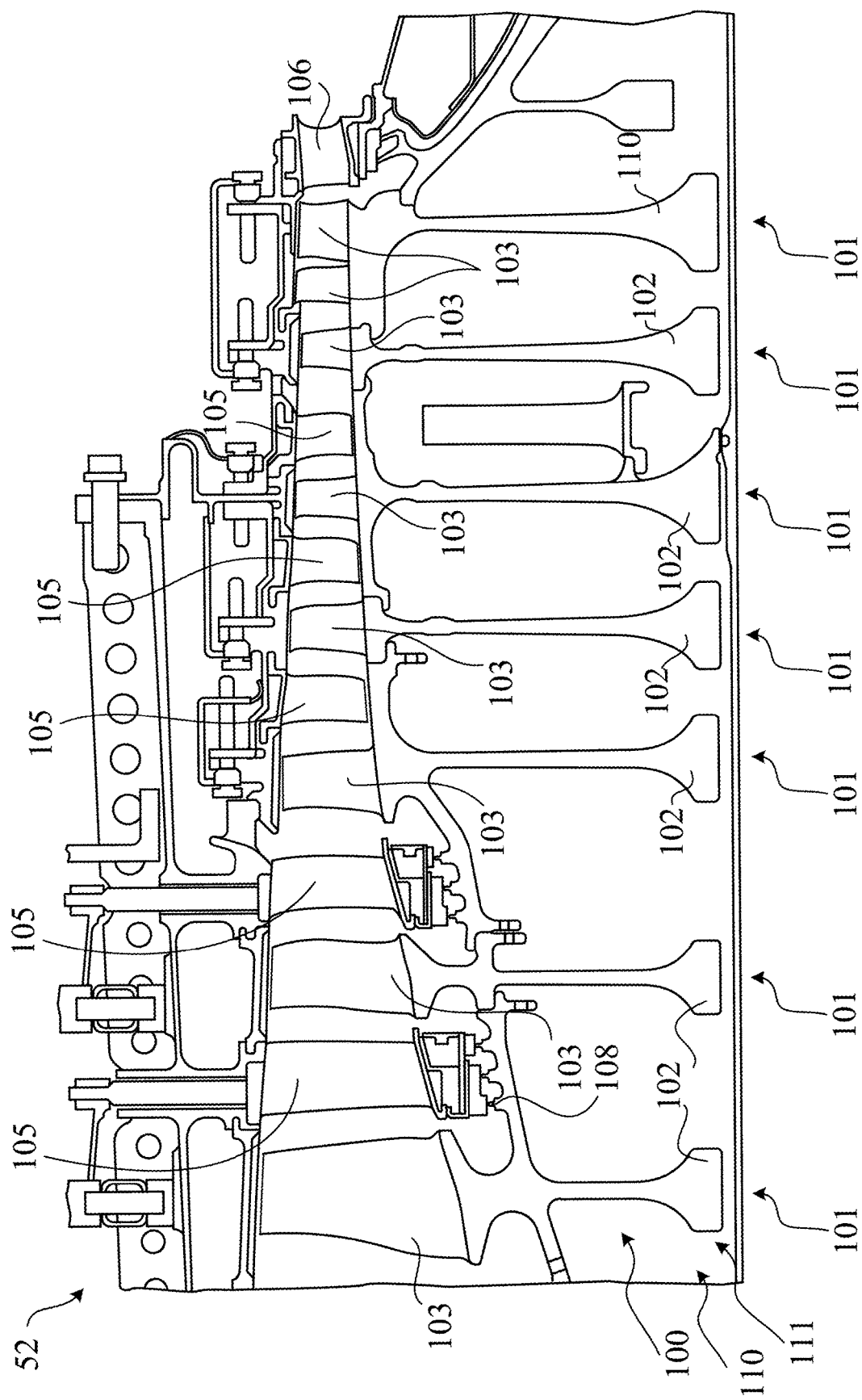
FIG. 1B illustrates a cross-sectional view of a high pressure compressor, in accordance with various embodiments.

In various embodiments, and with reference to FIG. 1B, high pressure compressor 52 of the compressor section 24 of gas turbine engine 20 is provided. The high pressure compressor 52 includes a plurality of blade stages 101 (i.e., rotor stages) and a plurality of vane stages 105 (i.e., stator stages). The blade stages 101 may each include an integrally bladed rotor ("IBR") 100, such that the blades 103 and rotor disks 102 are formed from a single integral component (i.e., a monolithic component formed of a single piece). Although described herein with respect to an IBR 100, the present disclosure is not limited in this regard. For example, the inspection, analysis, and repair systems disclosed herein can be utilized with bladed rotors formed of separate blades 103 and rotor disks 102 and still be within the scope of this disclosure.

The blades 103 extend radially outward from the rotor disk 102. The gas turbine engine 20 may further include an exit guide vane stage 106 that defines the aft end of the high pressure compressor 52. Although illustrated with respect to high pressure compressor 52, the present disclosure is not limited in this regard. For example, the low pressure compressor 44 may include a plurality of blade stages 101 and vane stages 105, each blade stage in the plurality of blade stages 101 including the IBR 100 and still be within the scope of this disclosure. In various embodiments, the plurality of blade stages 101 form a stack of IBRs 110, which define, at least partially, a rotor module 111 of the high pressure compressor 52 of the gas turbine engine 20.

Figure 2:
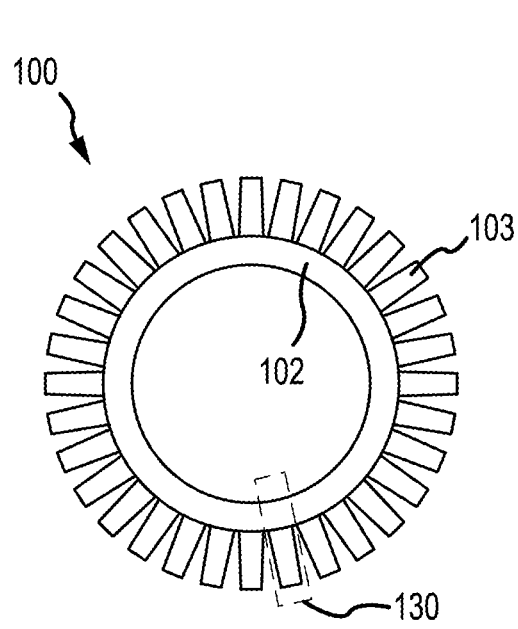
FIG. 2 illustrates a front view of a bladed rotor, in accordance with various embodiment.

Referring now to FIG. 2, a front view of an IBR 100 is illustrated, in accordance with various embodiments. The IBR 100 includes a rotor disk 102 and a plurality of blades 103 extending radially outward from the rotor disk 102.

When debris is ingested into the gas turbine engine 20, the debris can pass into the primary flowpath. Due to the rotation of the blades 103 in the primary flowpath, the debris can contact one or more of the blades 103. This contact can cause damage or wear to a blade 103, or a set of the blades 103. Disclosed herein are systems and methods for inspection, analysis, and repair of an IBR 100 and for returning an IBR 100 back to service after inspection (or after repair). The systems and methods disclosed herein facilitate more robust dispositions the more the process is utilized. In this regard, the systems and methods disclosed herein account for various performance parameters and select a repair process based on balancing these various performance parameters, in accordance with various embodiments.

Figure 3:
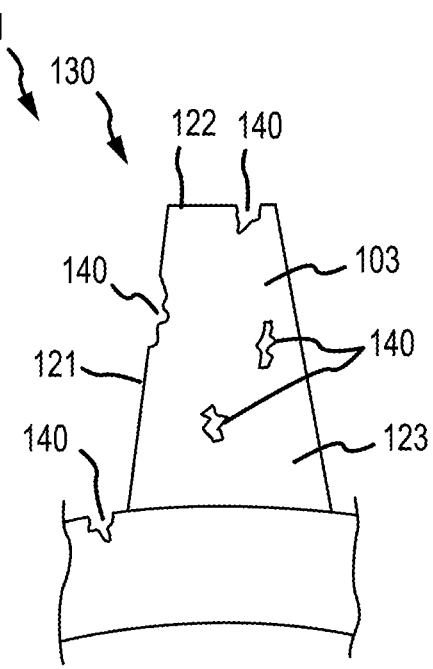
FIG. 3 illustrates a portion of an inspected bladed rotor, in accordance with various embodiments.

With combined reference to FIGS. 2 and 3, a damaged portion 130 from FIG. 2 of an IBR 100 including a substantial number of defects 140 (e.g., damage, wear, etc.) resulting from use of the IBR 100 in the gas turbine engine 20 from FIG. 1A over time is illustrated, in accordance with various embodiments. The size and shape of the defects 140 illustrated in FIG. 3 are exaggerated for illustrative effect. Further, the defects 140 can extend to all of the blades 103 of the IBR 100, the rotor disk 102, a set of the blades 103 of the IBR 100, a single blade in the blades 103, none of the blades 103, or the like.

In order to repair the defect 140, a blending operation can be performed on the IBR 100. A blending operation uses a material removal process, such as milling or computer numerical control (CNC) machining, to remove the damaged portion of the IBR 100 and smooth the resulting voids such that the IBR 100 can be re-introduced into service for further use (i.e., meeting structural and/or aerodynamic criteria for further use in service).

Figure 4:
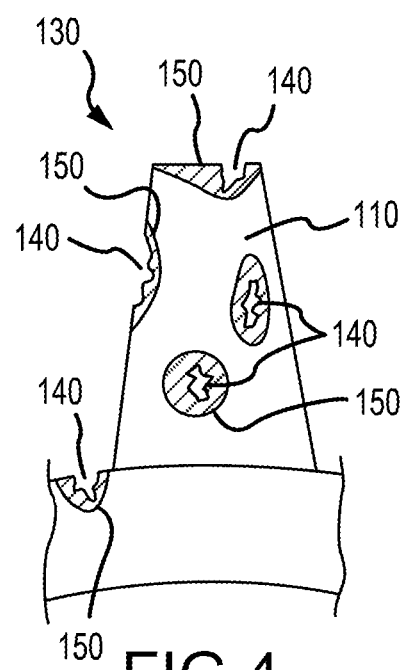
FIG. 4 illustrates a portion of the inspected bladed rotor during repair, in accordance with various embodiments.

Referring now to FIG. 4, the damaged portion 130 of an inspected IBR 131 with an additional blending mask 150 applied to each of the locations of the defects 140 is illustrated, in accordance with various embodiments. As with the locations of the defects 140, the blending masks 150 are highly exaggerated in scale for explanatory effect. The blending masks 150 can be physical masking applied to the IBR 100, or shaded colors on computer simulations of the IBR 100. In either case, the blending masks 150 indicate what portions of the material of the blade 103 and/or the rotor disk 102 should be removed in order for the IBR 100 to be suitable for utilization in the gas turbine engine 20 after blending. The blending mask 150 ensures that accurate and consistent blends are made in operations that manual removal operations for removal of material. Although illustrated as having blending mask 150, the present disclosure is not limited in this regard. For example, repair process can be performed, as described further herein, using automated processes, such as computer numerical control (CNC) machining or the like without the use of a blending mask 150 and still be within the scope of this disclosure.

Once the blending mask 150 has been applied, material is removed using the generally manual material removal operation resulting in a repaired blade portion 172 of a repaired IBR 170 including a plurality of repair blend profiles 160, as is illustrated in FIG. 5A.

In various embodiments, each repair blend profile in the plurality of repair blend profiles 160 is based, at least partially, on a defect shape of a respective defect 140 from FIG. 3. In various embodiments, as described further herein, the systems and methods disclosed herein facilitate a greater number of potential repair options for a respective defect 140 from FIG. 3. For example, if a repair blend was too large and fell out of experience based functional criteria, an IBR 100 could be scrapped as opposed to being blended as described further herein and placed back into service. Additionally, in various embodiments, a repair patch could be utilized instead of a repair blend to fill a void as opposed to scrapping an IBR 100, as described further herein. In this regard, the processes disclosed herein can result in a greater number of repair options, which can facilitate choosing a repair option based on improving a desired performance parameter, in accordance with various embodiments, as described further herein.

In various embodiments, explicit instructions are derived from the automated process and supplied to a computer numerical controlled (CNC) machine. In this instance, blending masks may not be utilized as the manual blending operation is replaced by the machine automated process. Blends of IBR 100 can be by either manual or automated processes, or a combination of those processes. In wholly automated processes, the creation of the mask can be omitted.

In addition to removing the locations of the defects 140, it is beneficial to remove material deeper than the observed damage in order to ensure that all damage is removed and to prevent the propagation of new damage. In various embodiments, a blend aspect ratio (e.g., a length–depth ratio) is maintained in order to ensure that there is a smooth and gradual transition from the edge of the undamaged blade 103 to the bottom of the deepest portion of the blend, and then back to the undamaged surface of the blade 103 on the other side of the blend.

Although FIGS. 2-5A illustrate repair solutions applied to the IBR 100 in locations including the rotor disk 102, the blade 103, an edge 121 (e.g., a leading edge or a trailing edge), a tip 122, an airfoil surface 123 (e.g., a pressure surface or a suction surface), it can be appreciated that a repair of each location shown on the same blade 103 is unlikely. The various locations are shown for illustrative purposes of potential repair locations, in accordance with various embodiments. The illustrated defects 140, blending masks 150, and repair blend profiles 160 on the IBR 100 are exemplary of the limited applications and not of every repair made according to the description herein.

In order to assist with the blending process and, facilitate efficient determination of acceptability of an IBR 100 to return into service, a semi-automated (or fully automated) system is utilized to inspect, analyze, and repair an IBR 100, in accordance with various embodiments.

In various embodiments, repair blend profiles 160 can include a scallop shape (e.g., repair blend profile 162 from FIG. 5B), a tear drop shape (e.g., repair blend profile 166 from FIG. 5A), a material reduction along an edge (i.e., chord reduction) (e.g., repair blend profile 168 from FIG. 5D), or the like. The present disclosure is not limited in this regard.

For example, with reference now to FIGS. 5B, and 5C, a repair blend profile 162 is illustrated. In various embodiments, the repair blend profile 162 comprises a convex shape and defines a recess in an outer surface of the repaired IBR 170 (e.g., a pressure surface, a suction surface, a rotor disk surface, or the like). In various embodiments, the repair blend profile is recessed from the outer surface 164 of the repaired IBR 170. In various embodiments, the repair blend profile 162 comprises a depth D1, a length L1 and a width W1. In various embodiments, the repair blend has a length L1 that is greater than a width W1. However, the present disclosure is not limited in this regard. For example, the length L1 can be equal to the width W1, in accordance with various embodiments. An aspect ratio of a blend profile, as referred to herein, refers to a length L1 dived by a width W1 of the repair blend profile. In various embodiments, the repair blend profile is substantially symmetric about a plane defined by a first point, a second point and a third point. The first point can be a max depth location. The second point and the third point can define a line that measures a maximum length (e.g., length L1) of the repair blend, in various embodiments. In various embodiments, the second point and the third point can define a line that measures a width in a perpendicular direction from the length L1. The present disclosure is not limited in this regard. As referred to herein, "substantially symmetrical" is a first profile on a first side of the plane that is within a profile of between 0.01 inches (0.025 cm) and 0.25 inches (0.64 cm) from the second profile on the second side of the plane, or between 0.01 inches (0.025 cm) and 0.125 inches (0.32 cm), or between 0.01 inches (0.25 cm) and 0.0625 inches (0.16 cm).

Figure 5E:
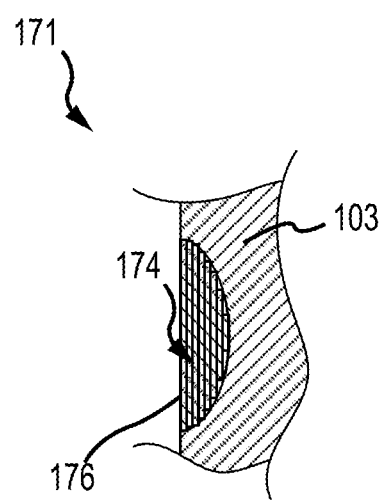
FIG. 5E illustrates a repair patch profile, in accordance with various embodiments.

Although described herein as being substantially symmetrical, the present disclosure is not limited in this regard. For example, the repair blend profile can comprise a tear drop shape (e.g., repair blend profile 166 from FIG. 5B), a chord reduction (i.e., shorting a chord length by a chord reduction length C1 along a span of the blade 103 of the repaired IBR 170 as shown in FIG. 5D), or the like. The present disclosure is not limited in this regard. In Referring now to FIG. 5E, a portion of a repaired IBR 171 having a repair patch profile 174 is illustrated, in accordance with various embodiments. various embodiments, a defect (e.g., defects 140 from FIG. 3), or a repair blend profile (e.g., repair blend profile 162, 166) can be filled with additive material 176 to define a repair patch profile 174. In various embodiments, the additive material 176 can be layers deposited by any additive manufacturing method. In various embodiments, the additive material 176 can be a similar material to a material of the blade 103. For example, if the blade is a titanium alloy, the additive material 176 can also be a titanium alloy. However, due to additive manufacturing producing a different composition relative to traditional manufacturing, the additive material 176 can have different material properties compared to the material of the blade 103. In this regard, evaluations to ensure bond strength, properties for the additive material 176, etc. can be performed in response to analyzing a repair patch profile 174, in accordance with various embodiments.

Figure 6:
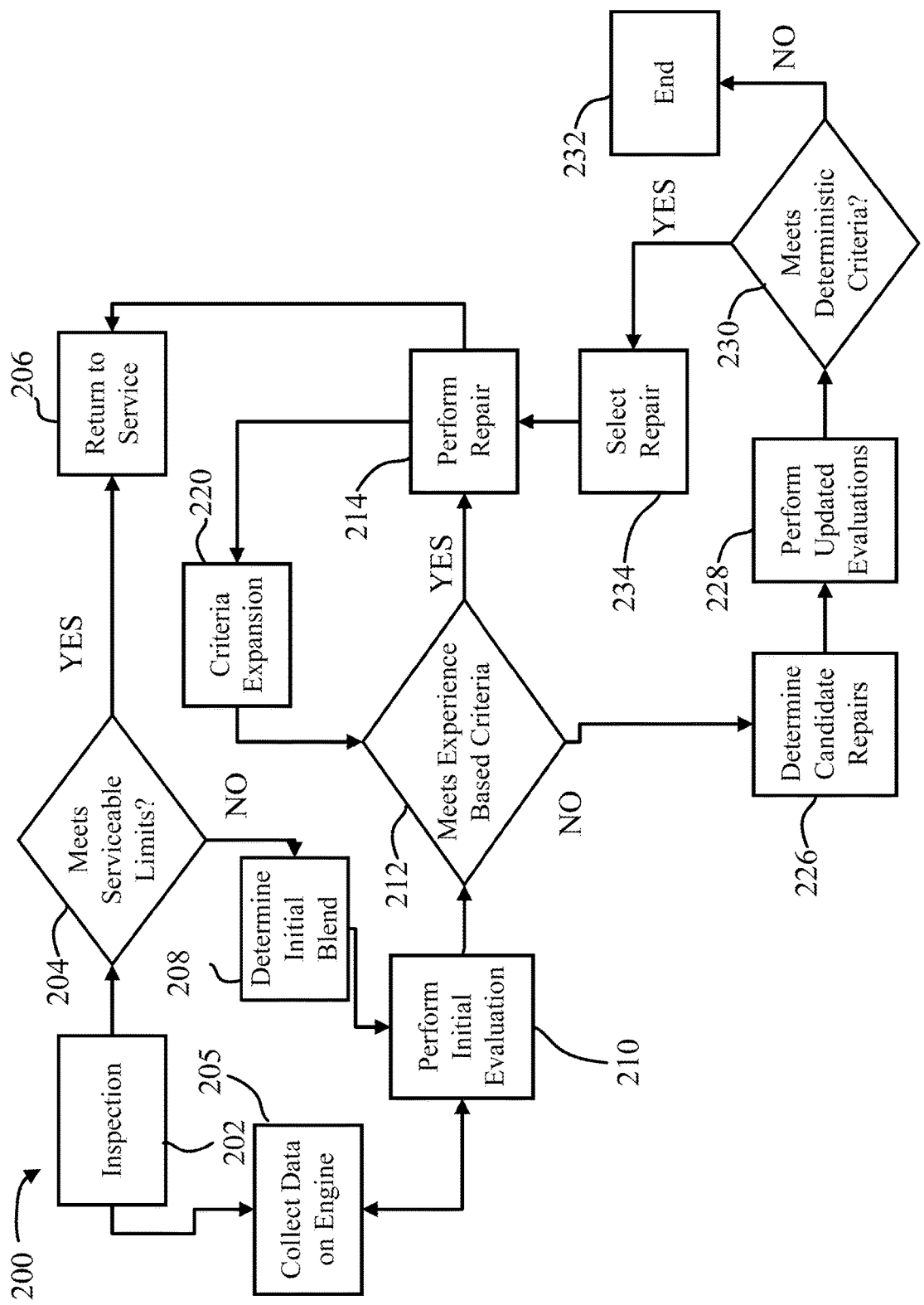
FIG. 6 illustrates an inspection, analysis, and repair process for a bladed rotor, in accordance with various embodiments.

Referring now to FIG. 6, a process 200 for repairing an IBR 100 from FIG. 1B from a compressor section (e.g., compressor section 24) of a gas turbine engine 20 from FIG. 1A is illustrated, in accordance with various embodiments. For example, after a predetermined number of flight cycles, or due to an unscheduled maintenance, the process 200 may be performed for one or more of IBR 100 in the compressor section 24 of the gas turbine engine 20. In various embodiments, process 200 accumulates data over time, creating greater fidelity and improving future IBR repair determinations, in accordance with various embodiments.

Figure 7:
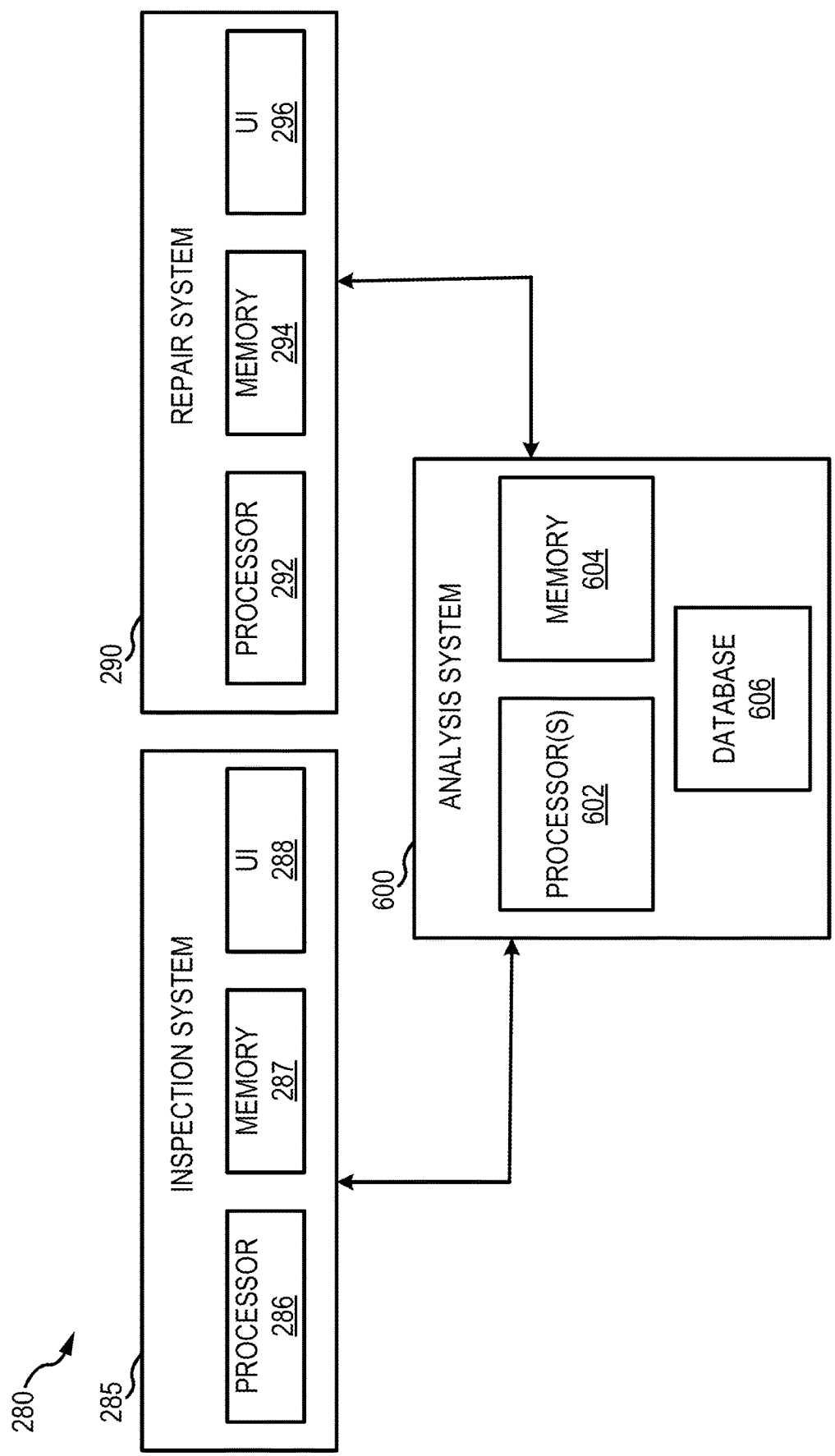
FIG. 7, illustrates a system to perform the inspection, analysis, and repair process of FIG. 6, in accordance with various embodiments.
Figure 8:
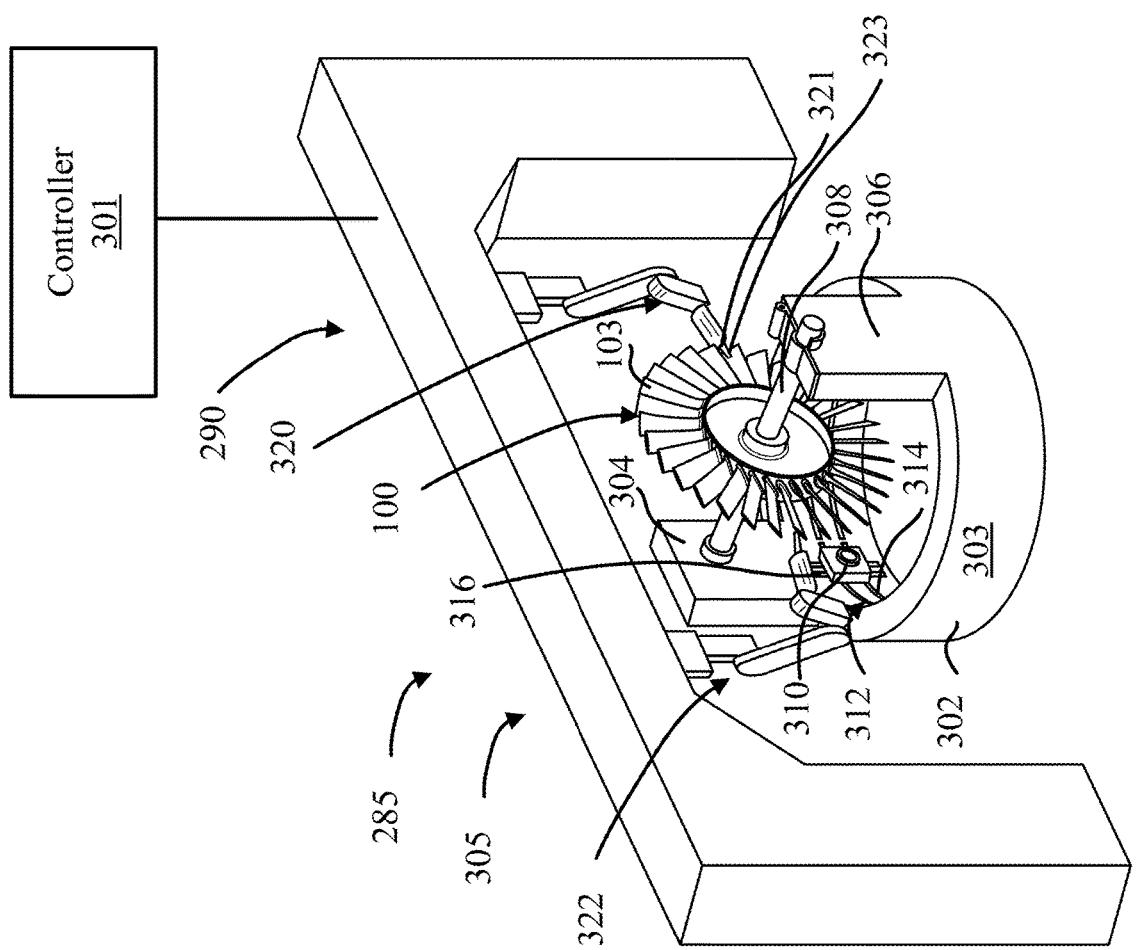
FIG. 8 illustrates an inspection and/or repair system, in accordance with various embodiments.

The process 200 comprises inspection of a bladed rotor (e.g., an IBR 100 from FIG. 1B) (step 202). In various embodiments, the dimensional inspection can be performed by an inspection system (e.g., inspection system 285 shown in FIGS. 7 and 8 further herein). In various embodiments, the dimensional inspection can be facilitated by use of an optical scanner (e.g., structured light scanners, such as white light scanners, structured blue light scanners, or the like) and/or a coordinate-measuring machine. The present disclosure is not limited in this regard. Thus, step 202 can further comprise scanning the IBR 100 with a scanner (e.g., structured light scanners, such as white light scanners, structured blue light scanners, and/or, a coordinate-measuring machine). In response to scanning the IBR 100, a digital representation of the IBR 100 (e.g., a point cloud, a surface model, or the like) from FIGS. 2-3 can be generated (e.g., via the inspection system 285 from FIGS. 7 and 8). In this regard, the defects 140 of the IBR 100 can be graphically depicted in a three-dimensional model (e.g., a Computer Aided Design (CAD) model or Finite Element Model (FEM), an aerodynamic model, or the like. However, an FEM model (or aerodynamic model) that includes the defects 140 (i.e., with rough surfaces or the like), can cause issues with running structural and/or aerodynamic simulations. In this regard, the inspection system 285 (as shown in FIGS. 7 and 8) can be configured to generate or determine an initial (or baseline) blend shape (e.g., repair blend profile 162 from FIG. 5B, repair blend profile 166 from FIG. 5A, etc.) based on data from inspection step 202 (i.e., scanner data), expertise (i.e., previously acceptable repair shapes or the like), etc. as described further herein.

In various embodiments, the inspection step 202 can be performed on an IBR in an uninstalled state or an installed state. In an installed state, the IBR 100 can be inspected while installed in the rotor module 111 in the high pressure compressor 52 of the gas-turbine engine 20 as illustrated in FIGS. 1A and 1B. For example, a borescope can be utilized to inspect an IBR 100 while in an installed state, in accordance with various embodiments. In an uninstalled state, the IBR 100 can be inspected via an inspection system 285 or a system 280 as described further herein.

In various embodiments, the three-dimensional model generated from step 202 includes a digital representation each defect of the IBR 100 from FIGS. 2-3. In this regard, the process 200 further comprises determining whether the IBR 100 meets serviceable limits (step 204). In various embodiments, "serviceable limits" as described herein refers to objective parameter limits of defects (e.g., wear, damage, etc.) for the IBR 100. For example, an objective parameter limit can be a threshold defect depth, a threshold defect length, a threshold defect aspect ratio, a threshold number of defects per blade, a threshold number of defects per IBR 100, any combination of the objective parameter limits disclosed herein, or the like. The present disclosure is not limited in this regard, and one skilled in the art may recognize various objective parameters for quantifying whether an IBR meets serviceable limits and be within the scope of this disclosure. In various embodiments, step 204 can be performed by an inspection system 285 or an analysis system 600 as described further herein. The present disclosure is not limited in this regard. If step 204 is performed by the inspection system 285, a determination on whether the IBR 100 is serviceable can be made rather quickly, on-site at an overhaul facility, in various embodiments. If step 204 is performed by the analysis system 600, a quick turnaround could still be achieved via cloud computing, or the like, as described further herein, in accordance with various embodiments. In this regard, step 204 can potentially be determined more quickly due to greater potential computing power in a cloud based environment.

In various embodiments, in response to the IBR 100 meeting serviceable limits in step 204, the process further comprises returning the IBR 100 to service (step 206). In this regard, the IBR 100 can be re-installed on a gas turbine engine 20 from FIG. 1A if the IBR 100 is in an uninstalled state, or the IBR 100 can simply be approved for return to service if the IBR 100 is in an installed state. In various embodiments, the IBR 100 is installed on the same gas turbine engine 20 from which it was removed from in response to being in an uninstalled state. However, the present disclosure is not limited in this regard, and the IBR 100 could be installed on a different gas turbine engine 20 from which it was removed and still be within the scope of this disclosure.

In various embodiments, in response to the IBR 100 not meeting serviceable limits in step 204, an initial evaluation of the IBR 100 can be performed (step 210). In various embodiments, the initial evaluation can include an initial, or baseline, blend profile (e.g., repair blend profile 162, repair blend profile 166, or repair blend profile 168 from FIGS. 5A-D). For example, an initial blend profile can be determined and/or generated for each defect 140 of the IBR 100. In various embodiments, initial blend profiles can only be determined/generated for defects 140 that do not meet the objective defect parameter(s) from step 204. In various embodiments, digital representation of a repair blend profile 160 is generated for all defects 140 of the IBR 100. The present disclosure is not limited in this regard.

In various embodiments, the initial blend profile is based on consistent parameters and is generated automatically via the process 200. For example, each initial blend profile may be determined in step 208 to remove a predetermined amount of additional material and to generate a smooth blend across the entirety of the defect (e.g., transforming a digital representation of defects 140 to repair blend profiles 160). In various embodiments, a model is generated in step 210 prior to the initial evaluation. The model generated in step 208 can be a three-dimensional model (e.g., a Computer Aided Design (CAD) model or Finite Element Model (FEM)), a plurality of two-dimensional section models (e.g., defining various cross-sections of a blade 103), or the like.

In various embodiments, an initial model generated in step 208 is configured to greatly reduce a file size of inspection data from step 202 to transfer relevant inspection data to an external analysis system (e.g., analysis system 600 as described further herein). In this regard, instead of a three-dimensional model, the scanner data can be converted in section data for an airfoil at various span lengths from a root of the airfoil, as described further herein. Thus, by converting a point cloud generated from inspection data (e.g., from a structured scanner or CMM machine as described previously herein), excess data that may be irrelevant for analysis of the inspected IBR 100 can be removed, to facilitate a quick and/or easy transfer of the relevant data to the analysis system 600 as described further herein.

In various embodiments, the model generated in step 208 can be converted into a three-dimensional model for use in various third party software programs, such as ANSYS, ANSYS Workbench, ANSYS Computational Fluid Dynamics (CFD), or the like. In this regard, after transferring the model from step 208 from the inspection system to the analysis system, the model from step 208 can be converted to a finite element model (FEM) for a structural analysis, an aerodynamic model for aerodynamic analysis, or the like. In this regard, a file size of the model from step 208 can be relatively small compared to a model size used in the structural analysis and/or the aerodynamic analysis as described further herein.

Although described herein as including an initial blend profile in step 208, the present disclosure is not limited in this regard. For example, for defects that are relatively smooth and can have digital representations that are capable of being read by various simulations, an initial blend profile may not be modeled and the actual defect may be modeled instead.

In various embodiments, the process 200 further comprises performing initial evaluations (step 210). In various embodiments, the initial evaluations can be performed on a digital representation of the inspected IBR from step 202 with or without an initial blend profile from step 208 modeled therein (e.g., a "repaired IBR digital model" or an "inspected IBR digital model" as described further herein). In this regard, structural, aerodynamic, and/or operability evaluations can be performed in step 210 for a digital representation of a repaired IBR 170 or an inspected IBR 131, in accordance with various embodiments. The repaired IBR digital model or the inspected IBR digital model can be a CAD model, an FEM model based on a specific analytical simulation being performed, a two dimensional section model (as described further herein), or the like. A repaired IBR as described herein refers to a repaired IBR 170 with at least one repaired blade portion 172 having at least one repair profile (e.g., repair blend profile 162, 166, or 168 from FIGS. 5A-D, repair patch profile 174, or the like). The digital representation of the repaired IBR digital model is based on the inspected IBR that was inspected in step 202 and modeled with initial blend profiles for a plurality of defects 140 in the IBR 100, in accordance with various embodiments.

In various embodiments, the process 200 can further comprise collecting data on a current state of the gas turbine engine 20 from FIG. 1A that had (or has) the inspected IBR 100 disposed thereon (step 205). In various embodiments, the data can include a current physical state of the engine (e.g., module level and/or part level data). In various embodiments, the physical state of the engine can include dimensional detail for each IBR in the rotor module 111 from FIG. 1B. In this regard, all IBRs in the rotor module 111 can be inspected in accordance with step 202 and stored at step 205 prior to proceeding with the evaluation in step 210. In various embodiments, the data can include recent engine operation data. For example, recent engine operation data can include thrust, fuel burn, thrust specific fuel consumption, stall margin, compressor efficiency, temperature data, etc. In this regard, the initial evaluations can in step 210 can be based on actual engine performance data, as opposed to design criteria data, in accordance with various embodiments.

In various embodiments, the initial evaluations performed in step 210 can be for engine performance, engine operability, aerodynamic module performance, aerodynamic part level performance, and/or structural performance.

Engine Performance

In various embodiments, the initial evaluation in step 210 can be an engine performance evaluation. In various embodiments, the engine performance evaluation can comprise a numerical propulsion system simulation (NPSS) (e.g., via a non-linear thermodynamic modeling environment), a reduced order engine model (e.g., via MATLAB or the like), influence coefficient matrix for gas path analysis, or the like.

In various embodiments, input parameters for an engine performance evaluation can include a change in performance parameter (e.g., a change in flow capacity, a change in efficiency, and/or a change in clearance). In various embodiments, the change in performance can be measured as compared to initial performance or design performance. The present disclosure is not limited in this regard. An "initial performance" as disclosed herein refers to a performance of a gas turbine engine 20 from FIG. 1A directly after original manufacture. A "design performance" as disclosed herein refers to a design specification for the gas turbine engine 20 (i.e., a minimum level of performance for the gas turbine engine 20 from FIG. 1A).

In various embodiments, based on the engine performance analysis performed, various output parameters can be analyzed. For example, output parameters for an engine performance analysis can include thrust, fuel burn, thrust specific fuel consumption, margins to maximum rated speed, pressure, and/or temperature, time on wing (e.g., for exhaust gas temperature margin, hot gas-path section repair intervals, and/or life limited parts). In various embodiments, the output parameters can be evaluated to assess that engine specifications and engine metrics will be met for the repaired IBR or the inspected IBR without a repair, in accordance with various embodiments. In this regard, the output parameters from the engine performance evaluation can be compared to engine metrics and/or engine specifications to determine whether the engine metrics and/or engine specifications are met for the respective initial blend profile from step 208 (or another repair option as described further herein) or the inspected IBR without a repair, in accordance with various embodiments. In various embodiments, the engine metrics and/or engine specifications must be met in order to proceed to another evaluation. In various embodiments, margins from the engine specifications and/or metrics can be optimized and/or balance with other evaluation factors, as described further herein. The present disclosure is not limited in this regard.

Engine Operability

In various embodiments, the initial evaluation in step 210 can include an engine operability evaluation. In various embodiments, the engine operability evaluation can comprise a numerical propulsion system simulation (NPSS) (e.g., via a non-linear thermodynamic modeling environment), a reduced order engine model (e.g., via MATLAB or the like), influence coefficient matrix for gas path analysis, or the like.

In various embodiments, input parameters for an engine operability evaluation can include a change in performance parameter (e.g., a change in flow capacity, a change in efficiency, and/or a change in clearance). In various embodiments, the change in operability can be measured as compared to initial operability or design operability. The present disclosure is not limited in this regard. An "initial operability" as disclosed herein refers to a performance of a gas turbine engine 20 from FIG. 1A directly after original manufacture. A "design operability" as disclosed herein refers to a design specification for the gas turbine engine 20 (i.e., a minimum level of performance for the gas turbine engine 20 from FIG. 1A).

In various embodiments, based on the engine operability analysis performed, various output parameters can be analyzed. For example, output parameters for an engine operability analysis can include remaining stall margin, transient time periods (e.g., for acceleration, deceleration, and/or starting of the gas turbine engine 20 from FIG. 1A), stability bleed efficiency, compressor efficiency during inclement weather, or the like. In various embodiments, the output parameters can be evaluated to assess that engine safety and regulatory criteria is met for the repaired IBR or the inspected IBR without a repair, in accordance with various embodiments. In this regard, the output parameters from the engine operability evaluation can be compared to engine safety metrics and/or engine regulatory metrics to determine whether the engine safety metrics and/or engine regulatory metrics are met for the respective initial blend profile from step 208 (or another repair option as described further herein) or the inspected IBR without a repair, in accordance with various embodiments. In various embodiments, the engine safety metrics and/or engine regulatory metrics must be met in order to proceed to another evaluation. In various embodiments, margins from the engine safety metrics and/or engine regulatory metrics can be optimized and/or balance with other evaluation factors, as described further herein. The present disclosure is not limited in this regard.

Module Aerodynamic Performance

In various embodiments, the initial evaluation in step 210 can include a module aerodynamic performance evaluation. In various embodiments, the module aerodynamic evaluation can comprise a finite element analysis, a reduced order aerodynamic model (e.g., via MATLAB or the like), an empirical model based on empirical trends, or the like.

In various embodiments, input parameters for a module aerodynamic performance evaluation can include loss and turning models for the repaired IBR or the inspected IBR and operability limits (i.e., an operability envelope or the like) for the gas turbine engine 20 from FIG. 1A. A "loss and turning model" as described herein are models configured to determine probabilistic impact of geometric variability for a loss coefficient and turning angle for the repaired IBR or the inspected IBR, whichever IBR is being analyzed.

In various embodiments, based on the module aerodynamic performance analysis performed, various output parameters can be analyzed. For example, output parameters for a module aerodynamic performance analysis can include compressor efficiency, stall margin, or the like. In various embodiments, the output parameters can be evaluated to assess that fuel burn, thrust capability, time on wing, and aerodynamic safety criteria are met for the repaired IBR or the inspected IBR without a repair, in accordance with various embodiments. In this regard, the output parameters from the module aerodynamic performance evaluation can be compared to module aerodynamic design metrics (i.e., design efficiency and design stall margin for a nominal dimension IBR) to determine whether the module aerodynamic design metrics are met for the respective initial blend profile from step 208 (or another repair option as described further herein) or the inspected IBR without a repair, in accordance with various embodiments. In various embodiments, the aerodynamic design metrics (or an acceptable deviation from the aerodynamic design metrics) must be met in order to proceed to another evaluation. In various embodiments, margins from the aerodynamic design metrics can be optimized and/or balance with other evaluation factors, as described further herein. The present disclosure is not limited in this regard.

Part Aerodynamic Performance

In various embodiments, the initial evaluation in step 210 can include a part aerodynamic performance evaluation. In various embodiments, the part aerodynamic evaluation can comprise a finite element analysis, a reduced order aerodynamic model (e.g., via MATLAB or the like), an empirical model based on empirical trends, or the like.

In various embodiments, input parameters for a part aerodynamic performance evaluation can include airfoil geometry (e.g., determined from inspection data from the inspection step 202 of process 200), a description of a repair profile (e.g., location of repair and size of repair), or the like. In various embodiments, the airfoil geometry can be in the form of two-dimensional section models, a three-dimensional finite element model, a text description of coordinates (e.g., two-dimensional or three-dimensional) for input into a reduced order aerodynamic model, or the like.

In various embodiments, based on the part aerodynamic performance analysis performed, various output parameters can be used as input parameters in the module aerodynamic performance evaluation described above. For example, output parameters for a part aerodynamic performance analysis can include change in turning angle and change in loss coefficient relative to a design IBR (e.g., a nominally dimensioned IBR).

Low Cycle Fatigue

In various embodiments, the initial evaluation in step 210 can include a low cycle fatigue (LCF) structural evaluation. In various embodiments, the LCF structural evaluation can comprise a finite element analysis. For example, a finite element model based on the inspection data from step 202 can be utilized to perform the LCF structural evaluation.

In various embodiments, input parameters for a LCF structural evaluation can include airfoil geometry (e.g., determined from inspection data from the inspection step 202 of process 200), a description of a repair profile (e.g., location of repair and size of repair), or the like. In various embodiments, input parameters for LCF structural evaluations further comprise critical operating conditions (e.g., critical temperature and pressure conditions).

In various embodiments, based on the LCF structural evaluation performed, various output parameters can be analyzed. For example, output parameters for a LCF structural evaluation analysis can be steady stress (i.e., mean stress). The steady stress can be analyzed relative to a minimum number of flight cycles the airfoil could last without developing damage from the steady stress. In this regard, an expected remaining life after repair can be determined and compared relative to a remaining life of the gas turbine engine 20 from FIG. 1A. In various embodiments, the LCF structural evaluation can be balanced with other evaluations (e.g., a reduced life can be acceptable as long as the reduced life is above a minimum remaining life for the gas turbine engine 20 from FIG. 1A), in accordance with various embodiments.

High Cycle Fatigue—Module Level

In various embodiments, the initial evaluation in step 210 can include a high cycle fatigue (HCF) structural evaluation at the module level. In various embodiments, the HCF structural evaluation at the module level can comprise a finite element analysis. For example, a finite element model based on the inspection data from step 202 can be utilized to perform the HCF structural evaluation.

In various embodiments, input parameters for a HCF structural evaluation at the module level can include airfoil geometry (e.g., determined from inspection data from the inspection step 202 of process 200), a description of a repair profile (e.g., location of repair and size of repair), or the like.

In various embodiments, based on the HCF structural evaluation performed, various output parameters can be analyzed. For example, output parameters for a HCF structural evaluation analysis can be alternating stress of adjacent hardware (e.g., stators). For example, output parameters for the HCF structural evaluation analysis at the module level can be utilized to determine the impact the repaired IBR (or inspected IBR without the repair) can have on adjacent hardware. In this regard, the alternating stress of adjacent hardware from modal responses induced by the repaired IBR (or inspected IBR without repair) can be analyzed and evaluated, in accordance with various embodiments. In various embodiments, the output parameter for the HCF structural evaluation at the module level can comprise a tuning margin. A "tuning margin" as referred to herein is an acceptable margin in excitation frequency, as compared to a nominal design IBR. For example, a tuning margin can be 5%, −3% to +4%, or the like. The present disclosure is not limited in this regard.

High Cycle Fatigue—Part Level

In various embodiments, the initial evaluation in step 210 can include a high cycle fatigue (HCF) structural evaluation at the part level. In various embodiments, the HCF structural evaluation at the part level can comprise a finite element analysis. For example, a finite element model based on the inspection data from step 202 can be utilized to perform the HCF structural evaluation.

In various embodiments, input parameters for a HCF structural evaluation at the part level can include airfoil geometry (e.g., determined from inspection data from the inspection step 202 of process 200), a description of a repair profile (e.g., location of repair and size of repair), or the like. In various embodiments, the input parameters can include critical operating conditions (e.g., critical temperature and pressure conditions) (e.g., for inputs in computational dynamics analysis). In various embodiments, output parameters from the LCF evaluation can be utilized as input parameters in the HCF structural evaluation at the part level. For example, the mean stress can be utilized as an assumption that the part is experiencing the mean stress during a vibratory response, in accordance with various embodiments.

In various embodiments, based on the HCF structural evaluation performed, various output parameters can be analyzed. For example, output parameters for an HCF structural evaluation analysis at the part level can be alternating stress of the repaired IBR (or the inspected IBR without the repair). In various embodiments, the alternating stress can be analyzed relative to a Goodman margin. In this regard, the alternating stress can be compared to a maximum alternating stress that could result in a crack, or damage to the repaired IBR. In various embodiments, the Goodman margin can be debited for an additional factor of safety (e.g., 80% of maximum alternating stress, 70% of maximum alternating stress, or the like). The present disclosure is not limited in this regard. In various embodiments, the output parameters can further comprise flutter sensitivity due to the repair. In this regard, a flutter margin relative to a design standard can be analyzed. As long as the flutter margin is within an acceptable range, the repaired IBR (or inspected IBR without a repair) can be deemed acceptable to return to service.

In various embodiments, the process 200 further comprises analyzing the repaired IBR digital model (step 210). In various embodiments, the analysis in step 210 includes various evaluations, as described above. For example, the various simulations can further include simulations to evaluate a modal assurance criteria (MAC), a resonant frequency, an aerodynamic efficiency, a stall margin, damage tolerance, dynamic stress from vibration, or the like. In various embodiments, damage tolerance may be an optional criteria to analyze (e.g., if the bladed rotor is not an IBR but a bladed rotor having a distinct rotor disk and distinct blades). The simulations can be via various simulation software platforms described previously herein.

In various embodiments, analyzing the repaired IBR digital model can include optimizing the repair profile shape based on various parameters. For example, step 210 can include iterating the repair profile shape based on the various evaluations and results of the various evaluations described above. In various embodiments, the repair profile shape is only analyzed for the initial blend profile generated in step 208. However, the present disclosure is not limited in this regard.

In various embodiment, step 210 further comprises comparing the simulation results to experience based criteria.

For example, if an IBR 100 is known, based on prior test data during development, to have a resonant frequency that varies by a threshold percentage (e.g., 3%, 5%, 8%, etc.) from a nominal frequency, and if a threshold number of the IBR 100 have been in service for a threshold number of cycles (e.g., 2,000 flight cycles, 10,000 flight cycles, or the like), then an experience based criteria for the resonant frequency can be created. For example, if a modal analysis determines a resonant frequency for the repaired IBR digital model is within the threshold percentage, the experience based criteria for resonant frequency would be considered met because the experimental data from development that indicates that the IBR 100 varies in resonant frequency by the threshold percentage without issue has been validated by experience by the threshold number of the IBR 100 having been in service for the threshold number of cycles. Stated another way, the resonant frequency being acceptable within a threshold range of frequencies has been validated by experience in service.

Similarly, if an IBR 100 is known, based on prior test data during development, to have a MAC that varies by a threshold percentage (e.g., 3%, 5%, 8%, etc.) from a nominal MAC, and if the threshold number of the IBR 100 have each been in service for the threshold number of cycles, then an experience based-criteria for the MAC can be created. For example, if the simulation to determine the MAC for the for repaired IBR digital model is less than the nominal MAC plus the threshold percentage, the MAC can be determined acceptable as being validated by experience in a similar manner as the resonant frequency example provided above.

If an IBR 100 is known, based on prior test data during development, to have an aerodynamic efficiency that varies by a threshold percentage (e.g., 3%, 5%, 8%, etc.) from a nominal aerodynamic efficiency, and if the threshold number of the IBR 100 have each been in service for the threshold number of cycles, then an experience based-criteria for the aerodynamic efficiency can be created. For example, if the simulation for the repaired IBR digital model has a greater aerodynamic efficiency than the nominal aerodynamic efficiency less the threshold percentage, than the aerodynamic efficiency being acceptable has been validated by experience in the field.

In various embodiments, the acceptable experience based criteria for aerodynamic efficiency can be based on being greater than the aerodynamic efficiency determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a stall margin that varies by a threshold percentage (e.g., 3%, 5%, 8%, etc.) from a nominal stall margin, and if the threshold number of the IBR 100 have each been in service for the threshold number of cycles, then an experience based-criteria for the stall margin can be created. For example, if the simulation to determine stall margin for the repaired IBR digital model has a greater stall margin than the nominal aerodynamic stall margin less the threshold percentage, than the stall margin being acceptable has been validated by experience in the field.

In various embodiments, the acceptable experience based criteria for stall margin can be based on being greater than the nominal stall margin determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a damage tolerance (e.g., a threshold crack size that results in no growth during operation) that varies by a threshold percentage (e.g., 3%, 5%, 8%, etc.) from a nominal damage tolerance, and if the threshold number of the IBR 100 (e.g., 1,000 IBRs or the like) have been in service for the threshold number of cycles (e.g., 25,000 flight cycles or the like), then an experience based-criteria for the damage tolerance can be created. For example, if the simulation to determine damage tolerance for the repaired IBR digital model has a lower threshold crack growth size than the nominal threshold crack growth size plus the threshold percentage, than the damage tolerance being acceptable has been validated by experience in the field.

Thus, after analyzing the repaired IBR digital model in step 210, the process 200 further comprises determining whether the experienced based criteria is met for each experience-based criteria parameter (step 212). In various embodiments, the experience based criteria described herein is exemplary, and not all experience based parameters may be analyzed for a respective repaired IBR.

In various embodiments, in response to the evaluation data from the various evaluations showing that the experience based criteria is met, the process further comprises performing the repair on the IBR 100 that was inspected in step 202 with a repair process that generates the initial blend profiles (e.g., repair blend profile 162, 166, or 168 from FIGS. 5A-D, or the like) for each defect (e.g., defects 140 from FIG. 3) (step 214). In various embodiments, the repair process may be in accordance with the repair processes described with respect to FIGS. 2-5D. In various embodiments, the repair process is performed by a repair system as described further herein. The present disclosure is not limited in this regard. In various embodiments, step 212 is not performed and the analysis proceeds directly to step 226. In this regard, after performing an initial evaluation (e.g., with a potential initial repair or of the inspected IBR without repairs), the process 200 can proceed directly to determine candidate repairs in step 226. In this regard, in response to wanting to determine as many potential repair options and select a potential repair based on balancing various evaluations as described previously herein, it may be desirable to perform various evaluations for alternative repair options (e.g., in step 228 as described further herein.

In various embodiments, the process 200 further comprises expansion of experience based criteria in step 220 after performing the repair in step 214. In this regard, based on additional testing after performing the repair, threshold values can be updated for the experience based criteria to provide greater fidelity and generate faster dispositions for future repair processes, in accordance with various embodiments.

In various embodiments, in response to the experience based criteria not being met (or examining experience based criteria being skipped), the process 200 further comprises determining candidate repairs (step 226). In various embodiments, the candidate repairs can include alternative blend profile shapes, repair patch profiles (e.g., repair patch profile 174 from FIG. 5E), borescope blend repair shapes (e.g., blends capable of being performed via a borescope for installed IBRs), chord reduction or restoration repairs, or the like. In various embodiments, candidate repairs in step 226 can be based on additional factors from the initial evaluation in step 210. For example, if criteria from one of the evaluations is not being met, a candidate repair can be developed so that may improve an output parameter from the evaluation where the criteria is not being met. In this regard, a repair blend shape of a first IBR can be modified in step 226, so that an output parameter from the evaluations meets a respective metric for a second IBR, in accordance with various embodiments. In various embodiments, the candidate repairs can be chosen based on impacting other blades on single IBR or the like. The present disclosure is not limited in this regard.

In various embodiments, the process 200 further comprises performing updated evaluations for the candidate repair options determined in step 226. In this regard, the evaluations outlined in step 210 can be updated for all the candidate repair options in step 228.

In various embodiments, the updated evaluations in step 228 can be compared to a deterministic criteria in step 230. However, the present disclosure is not limited in this regard. For example, the updated evaluations can also be compared to an experience based criteria in a similar manner to step 212. For example, the candidate repairs determined in step 226 can have experience based criteria as well and a simpler comparison can potentially be performed (or fewer evaluations performed), in accordance with various embodiments. In this regard, the evaluations outlined in step 210 can be compared to deterministic criteria (i.e., design criteria or the like). For example, although a resonant frequency of the IBR may not be at a resonant frequency within the experience based range, the resonant frequency may result in a dynamic stress in stress limiting locations that is less than the dynamic stress induced by the IBR 100, which would result in an IBR 100 that is more robust with regards to dynamic stress relative to an ideal IBR (e.g., a newly manufactured IBR 100). In various embodiments, even if a resonant frequency that is not within the experience based range of resonant frequencies results in a greater dynamic stress in limiting locations, the dynamic stress can still be less than a threshold dynamic stress based on a Goodman diagram threshold. In various embodiments, the threshold dynamic stress can correspond to a maximum alternating stress for the material for a mean stress at the location of the dynamic stress. Thus, even if the resonant frequency is outside a range of resonant frequencies that are known to be acceptable based on experience, and the resonant frequency generates a greater dynamic stress relative to the ideal IBR 100, the repaired IBR 170 can still be acceptable based on the deterministic criteria, in accordance with various embodiments. In this regard, a greater number of acceptable repairs for IBRs can be generated and a greater fidelity can be created for the experience based criteria as the process 200 is repeated for numerous IBRs 100 over time.

In various embodiments, in response to the deterministic criteria being met in steps 230, a repair can be selected in step 234. In this regard, the various evaluations outlined in steps 210, 228 can be reviewed, and a repair can be selected based on balancing the evaluations with a cost and time associated with a respective repair, in accordance with various embodiments. In this regard, an optimal repair can be chosen based on the process 200 described herein, factoring in evaluations corresponding to engine performance, engine operability, module aerodynamic performance, part aerodynamic performance, low cycle fatigue, and high cycle fatigue.

In various embodiments, step 230 can output shape sensitivity data based on the updated evaluations in step 228. For example, various shapes and sizes of a repair blend can be analyzed in step 228 and a relative impact to each output parameter of the various evaluations can be output to provide a better picture of how a respective repair shape can impact various performance parameters, in accordance with various embodiments.

In various embodiments, in response to the deterministic criteria not being met, the process 200 ends at step 232. In various embodiments, in response to the process ending at step 232, the repaired IBR digital model can be stored in a database for later analysis (e.g., to see if a candidate repair in step 226 of another IBR can resolve the criteria not being met in step 230), and the IBR 100 can be placed in storage. In this regard, the candidate repaired IBR digital models could be utilized in later module or engine level evaluations to determine if any of the candidate repairs for the IBR would be acceptable based on a candidate repair of another IBR. Thus, the process 200 can result in acceptability of repaired IBRs that may have otherwise been scrapped, in accordance with various embodiments.

Referring now to FIG. 7, a system 280 for inspecting, analyzing, and repairing an IBR 100 is illustrated, in accordance with various embodiments. In various embodiments, the system 280 includes an inspection system 285, an analysis system 600, and a repair system 290. Although illustrated as separate systems with separate processors (e.g., processors 286, 602, 292), the present disclosure is not limited in this regard. For example, the system 280 may include a single processor, a single memory, and a single user interface and still remain within the scope of this disclosure.

Similarly, although inspection system 285 and repair system 290 are illustrated as separate systems with separate processors, memories and user interfaces, the present disclosure is not limited in this regard. For example, the inspection system 285 and the repair system 290 may be combined into a single system that communicates with the analysis system 600, in accordance with various embodiments.

In various embodiments, the analysis system 600 may include one or more processors 602. The analysis system 600 may be configured to process a significant amount of data during an analysis step as described further herein. In this regard, the analysis system 600 may be configured for remote computing (e.g., cloud-based computing), or the like. Thus, a processing time and a volume of data analyzed may be greatly increased relative to typical repair systems, in accordance with various embodiments.

In various embodiments, the inspection system 285, the analysis system 600, and the repair system 290 each include a computer system comprising a processor (e.g., processor 286, processor(s) 602, and/or processor 292) and a memory (e.g., memory 287, memory 604, memory 294). The inspection system 285 and the repair system 290 may each comprise a user interface (UI) (e.g., UI 288, UI 296). In various embodiments, the inspection system 285 and the repair system 290 may utilize a single user interface to control both systems. The present disclosure is not limited in this regard.

The analysis system 600 may further comprise a database 606. In various embodiments, the database 606 comprises various stored data for use in the analysis system 600. The database 606 may include an inspected IBR database (e.g., with data from various prior inspected IBRs), a repair data database (e.g., with data from various prior repairs performed/approved), a load data database (e.g., with engine load data from structural and/or aerodynamic analysis), a test data database (e.g., with engine specific test data used for validation of structural and/or aerodynamic analysis), a design data database (e.g., with design models having nominal dimensions according to a product definition of the IBR 100), and/or a material data database (e.g., with material for each component utilized in an analysis step), in accordance with various embodiments.

System 280 may be configured for inspecting, analyzing, and repairing an IBR 100, in accordance with various embodiments. In this regard, a repair process for an IBR 100 may be fully automated, or nearly fully automated, in accordance with various embodiments, as described further herein.

In various embodiments, systems 285, 600, 290 may each store a software program configured to perform the methods described herein in a respective memory 287, 604, 294 and run the software program using the respective processor 286, 602, 292. The systems 285, 600, 290 may include any number of individual processors 286, 602, 292 and memories 287, 604, 294. Various data may be communicated between the systems 285, 600, 290 and a user via the user interfaces (e.g., UI 288, UI 296). Such information may also be communicated between the systems 285, 600, 290 and external devices, database 606, and/or any other computing device connected to the systems 285, 600, 290 (e.g., through any network such as a local area network (LAN), or wide area network (WAN) such as the Internet).

In various embodiments, for systems 285, 600, 290, each processor 286, 602, 292 may retrieve and executes instructions stored in the respective memory 287, 604, 294 to control the operation of the respective system 285, 600, 290. Any number and type of processor(s) (e.g., an integrated circuit microprocessor, microcontroller, and/or digital signal processor (DSP)), can be used in conjunction with the various embodiments. The processor 286, 602, 292 may include, and/or operate in conjunction with, any other suitable components and features, such as comparators, analog-to-digital converters (ADCs), and/or digital-to-analog converters (DACs). Functionality of various embodiments may also be implemented through various hardware components storing machine-readable instructions, such as application-specific integrated circuits (ASICs), field-programmable gate arrays (FPGAs) and/or complex programmable logic devices (CPLDs).

The memory 287, 604, 294 may include a non-transitory computer-readable medium (such as on a CD-ROM, DVD-ROM, hard drive or FLASH memory) storing computer-readable instructions stored thereon that can be executed by the processor 286, 602, 292 to perform the methods of the present disclosure. The memory 287, 604, 294 may include any combination of different memory storage devices, such as hard drives, random access memory (RAM), read only memory (ROM), FLASH memory, or any other type of volatile and/or nonvolatile memory.

The system 285, 290 may receive and display information via a respective user interface (e.g., UI 288 and/or UI 296). The user interfaces (e.g., UI 288 and/or UI 296) include various peripheral output devices (such as monitors and printers), as well as any suitable input or control devices (such as a mouse and keyboard) to allow users to control and interact with the software program. Although illustrated as not including a user interface, the analysis system 600 is not limited in this regard. For example, a user interface for the analysis system 600 can have a user interface to facilitate load inputs, retrieval of information from the inspection system 285, or the like.

In various embodiments, inspection system 285 and repair system 290 may each be in electronic communication with analysis system 600, directly or via a respective user interface (e.g., UI 288 and/or UI 296). inspection system 285 and repair system 290 may comprise any suitable hardware, software, and/or database components capable of sending, receiving, and storing data. For example, inspection system 285 and/or repair system 290 may comprise a personal computer, personal digital assistant, cellular phone, smartphone (e.g., those running UNIX-based and/or Linux-based operating systems such as IPHONE®, ANDROID®, and/or the like), IoT device, kiosk, and/or the like. Inspection system 285 and/or repair system 290 may comprise an operating system, such as, for example, a WINDOWS® mobile operating system, an ANDROID® operating system, APPLE® IOS®, a LINUX® operating system, and the like. Inspection system 285 and/or repair system 290 may also comprise software components installed on inspection system 285 and/or repair system 290 and configured to enable access to various system 280 components. For example, inspection system 285 and/or repair system 290 may comprise a web browser (e.g., MICROSOFT INTERNET EXPLORER®, GOOGLE CHROME®, APPLE SAFARI® etc.), an application, a micro-app or mobile application, or the like, configured to allow the inspection system 285 and/or repair system 290 to access and interact with analysis system 600 (e.g., directly or via a respective UI, as discussed further herein).

Figure 9:
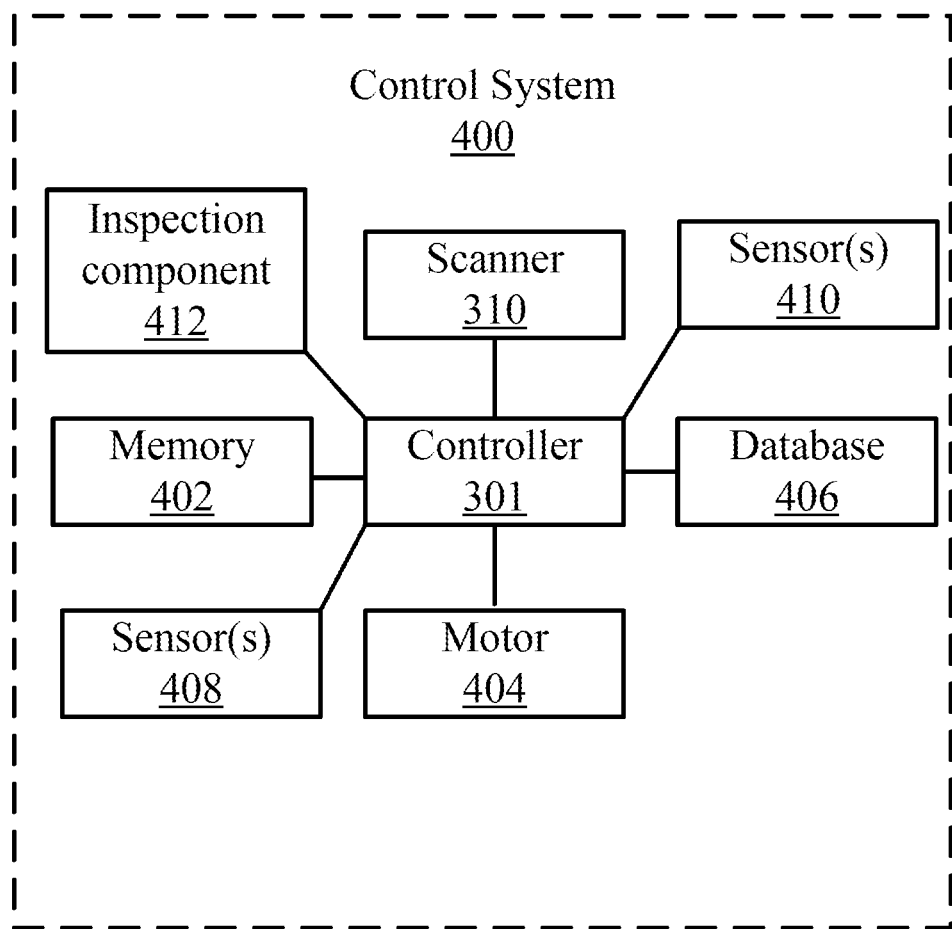
FIG. 9 illustrates a schematic view of a control system for an inspection system, in accordance with various embodiments.

Referring now to FIGS. 8 and 9, a perspective view of a system 285 for use in an inspection step 202 and/or a repair step 214 of process 200 (FIG. 8) and a control system 400 for the inspection system 285 (FIG. 9) are illustrated in accordance with various embodiments. In various embodiments, the system 285 comprises a repair system 290 and an inspection system 285. For example, various components of the system 285 may be configured to inspect the IBR 100 and generate a digital map of the IBR 100 (e.g., a point cloud), the inspection system 285 may be configured to transmit the digital map to an analysis system (e.g., analysis system 600), the inspection system 285 may then receive the results from the analysis system 600, and/or perform a repair based on a determination from the analysis system 600, in accordance with various embodiments.

The inspection system 285 comprises a controller 301, a support structure 302, a shaft 308, and a scanner 310. In various embodiments, the control system 400 comprises the controller 301, the scanner 310, a memory 402, a motor 404, a database 406, and sensor(s) 408, sensor(s) 410, and inspection component 412. In various embodiments, the inspection system 285 comprises a device 305 configured for bladed rotor repair and/or bladed rotor inspection.

In various embodiments, the support structure 302 comprises a base 303, a first vertical support 304, a second vertical support 306. In various embodiments, the base 303 may be annular in shape. Although illustrated as being annular, the present disclosure is not limited in this regard. For example, the base 303 may be semi-annular in shape, a flat plate, or the like. In various embodiments, the vertical supports 304, 306 extend vertically upward from the base 303 on opposite sides of the base (e.g., 180 degrees apart, or opposite sides if the base 303 where a square plate). The shaft 308 extends from the first vertical support 304 to the second vertical support 306. The shaft 308 may be rotatably coupled to the motor 404, which may be disposed within the first vertical support 304, in accordance with various embodiments. The shaft 308 may be restrained vertically and horizontally at the second vertical support 306 but free to rotate relative to the second vertical support about a central longitudinal axis of the shaft 308. In various embodiments, a bearing assembly may be coupled to the second vertical support 306 to facilitate rotation of the shaft, in accordance with various embodiments.

In various embodiments, the IBR 100 to be inspected in accordance with the inspection step 202 of the process 200 via the inspection system 285 may be coupled to the shaft 308 (e.g., via a rigid coupling, or the like). The present disclosure is not limited in this regard, and the shaft 308 may be coupled to the IBR 100 to be inspected by any method known in the art and be within the scope of this disclosure.

In various embodiments, the scanner 310 is operably coupled to a track system 312. In various embodiments, the track system 312 may comprise a curved track 314 and a vertical track 316. The vertical track 316 may slidingly couple to the vertical track 316 (e.g., via rollers or the like). The scanner 310 may be slidingly coupled to the vertical track 316 (e.g., via a conveyor belt, linkages, or the like). In various embodiments, the scanner 310 is configured to extend from the track system 312 towards the IBR 100 during inspection of the IBR 100 in accordance with step 202 of the process 200. In this regard, the inspection system 285 may further comprise a control arm 322 (e.g., a robot arm), an actuator (e.g., in combination with the track system 312) or the like. Although described herein with tracks 314, 316. a control arm 322, and/or an actuator of track system 312, the present disclosure is not limited in this regard. For example, any electronically controlled (e.g., wireless or wired) component configured to move the scanner 310, a machining tool (e.g., a mill, a cutter, a lathe, etc.), or the like in six degrees of freedom relative to the IBR 100 is within the scope of this disclosure.

In various embodiments, the inspection component 412 comprises rollers for the curved track, a conveyor belt for the vertical track, and/or a robotic arm coupled to the scanner 310. In various embodiments, the inspection component 412 comprises only a control arm 322 (e.g., a robot arm). In various embodiments, the inspection component 412 comprises only the rollers for the curved track 314 and the conveyor belt or linkages for the vertical track 316. The present disclosure is not limited in this regard. In various embodiments, the inspection component 412 is stationary and the IBR 100 being inspected is moveable along three-axis, five-axis, or the like. The present disclosure is not limited in this regard.

In various embodiments, the scanner 310 comprises a coordinate measuring machine (CMM), a mechanical scanner, a laser scanner, a structured scanner (e.g., a white light scanner, a blue light scanner, etc.), a non-structured optical scanner, a non-visual scanner (e.g., computed tomography), or the like. In various embodiments, the scanner 310 is a blue light scanner. In various embodiments, the scanner 310 may be swapped with another scanner at any point during an inspection step 202 as described further herein. In various embodiments, the inspection system 285 may be configured to swap the scanner 310 with a different scanner during the inspection step 202 of process 200 as described further herein.

A "blue light scanner" as disclosed herein refers to a non-contact structure light scanner. The blue light scanner may have a scan range of between 100×75 mm$^2$-400×300 mm$^2$, in accordance with various embodiments. In various embodiments, an accuracy of the blue light scanner may be between 0.005 and 0.015 mm. In various embodiments, the blue light scanner be able to determine distances between adjacent points in the point cloud of between 0.04 and 0.16 mm as measured across three axes. In various embodiments, a volume accuracy of the blue light scanner may be approximately 0.8 mm/m. In various embodiments, a scan depth may be between approximately 100 and 400 mm. In various embodiments, the blue light scanner may comprise a light source including a blue LED. In this regard, the blue light scanner may be configured to emit an average wavelength between 400 and 450 nm, in accordance with various embodiments. Although described with various specifications herein, the blue light scanner is not limited in this regard, and one skilled in the art may recognize the parameters of the blue light scanner may extend outside the exemplary ranges. Use of a blue light scanner provides a high resolution point cloud for a three dimensional object.

In various embodiments, the inspection system 285 further comprises a control arm 320 of the repair system 290. In various embodiments the control arm 320 comprises a tool holder 321. The tool holder 321 is configured to couple to a subtractive component 323 (e.g., a mill, a lathe, a cutter, etc.). In various embodiments, the control arm 322 of inspection system 285 may be a control arm for the repair system 290 as well. In various embodiments, the control arms 320, 322 may be used in both the repair system 290 and the inspection system 285. The present disclosure is not limited in this regard.

The controller 301 may be integrated into computer system of the inspection system 285 (e.g., in processor 286 and/or memory 287 from FIG. 2B). In various embodiments, the controller 301 may be configured as a central network element or hub to various systems and components of the control system 400. In various embodiments, controller 301 may comprise a processor (e.g., processor 286). In various embodiments, controller 301 may be implemented as a single controller (e.g., via a single processor 286 and associated memory 287). In various embodiments, controller 301 may be implemented as multiple processors (e.g., a main processor and local processors for various components). The controller 301 can be a general purpose processor, a digital signal processor (DSP), an application specific integrated circuit (ASIC), a field programable gate array (FPGA) or other programable logic device, discrete gate or transistor logic, discrete hardware components, or any combination thereof. The controller 301 may comprise a processor configured to implement various logical operations in response to execution of instructions, for example, instructions stored on a non-transitory, tangible, computer-readable medium configured to communicate with the controller 301.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

In various embodiments, the motor 404 of the control system 400 is operably coupled to the shaft 308 of the control system 400. In various embodiments, the motor 404 may comprise a direct current (DC) stepper, an alternating current (AC) motor or the like. The present disclosure is not limited in this regard. In various embodiments, the sensor(s) 408 include Hall effect sensor(s), optical sensor(s), resolver(s), or the like. In various embodiments, sensor(s) 408 may include sensor(s) configured to detect an angular position of the shaft 308 during an inspection step for an IBR 100 (e.g., step 202 from the process 200). In this regard, during inspection of the IBR 100, the controller 301 receives sensor data from the sensor(s) 408. The controller 301 can utilize the sensor data received from the sensor(s) 408 to correlate an angular position of the IBR 100 being inspected with a location of the scanner 310 as described further herein. In various embodiments, the IBR 100 may remain stationary throughout an inspection process (e.g., inspection step 202 of process 200) and only a control arm (e.g., control arm 320 and/or control arm 322) may move. Thus, coordinates of the control arm(s) may be determined via sensor(s) 408 in a similar manner to orient and construct the IBR 100 being inspected.

In various embodiments, the sensor(s) 410 are configured to detect a position of the scanner 310 during the inspection step 202 of process 200. In this regard, sensor(s) 410 may be position sensors (e.g., capacitive displacement sensors, eddy-current sensors, Hall effect sensors, inductive sensors, optical sensors, linear variable differential transformer (LVDT) sensors, photodiode array sensors, piezoelectric sensors, encoders, potentiometer sensors, ultrasonic sensors or the like). The present disclosure is not limited in this regard. Thus, during inspection of the IBR 100 in accordance with step 202 of process 200, controller 301 is able to determine a location of the scanner 310 and an angular position of the IBR 100 throughout the inspection. Thus, based on the location of the scanner 310, an angular location of the IBR 100 and scanning data received from the scanner 310, a digital map (e.g., a robust point cloud) can be generated during the inspection step 202 of process 200 for the IBR 100 being inspected. In various embodiments, the point cloud encompasses the entire IBR 100 (e.g., between 95% and 100% of a surface area of the IBR 100, or between 99% and 100% of the surface area of the IBR 100).

Figure 10:
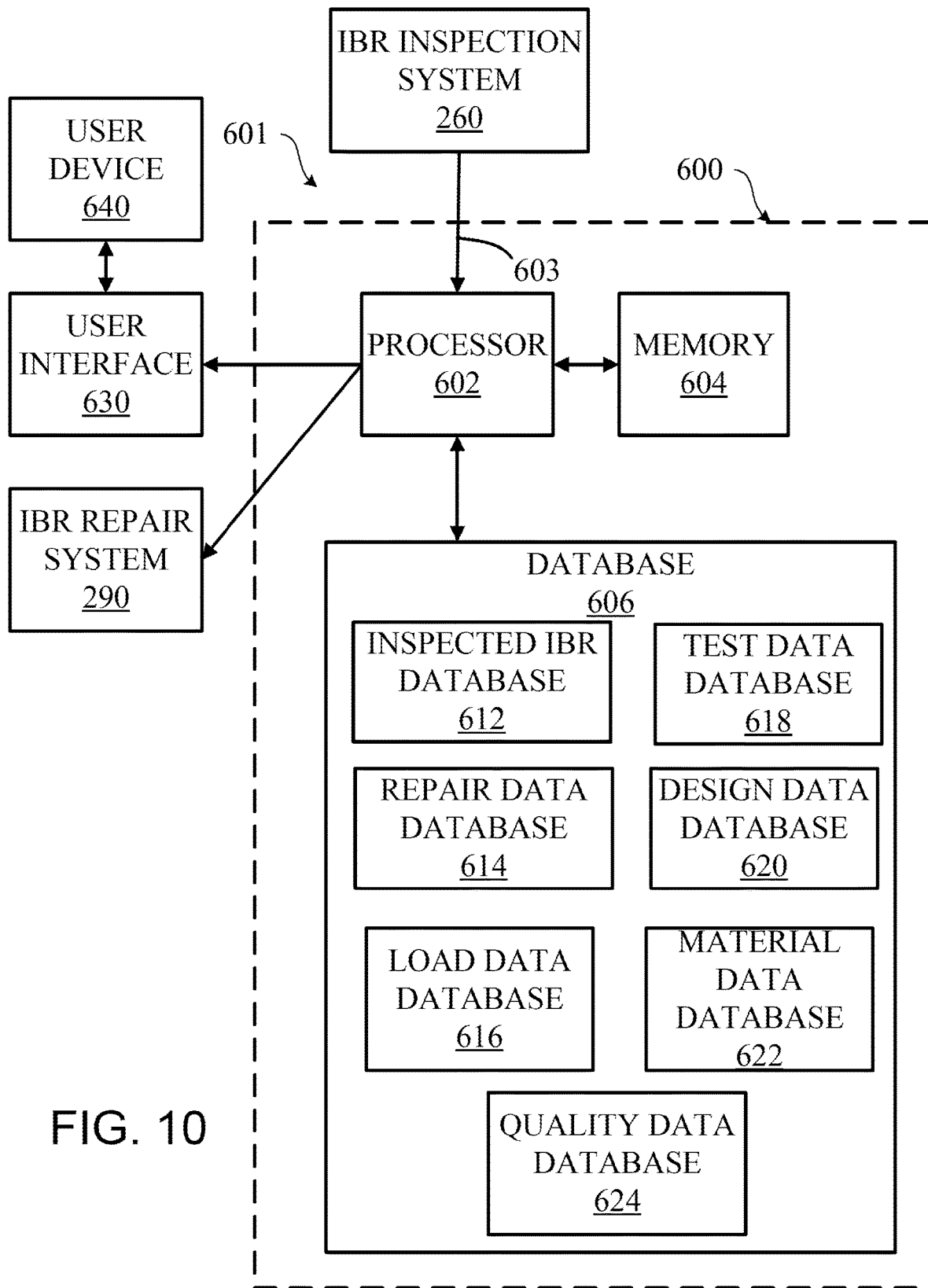
FIG. 10 illustrates a schematic view analysis system, in accordance with various embodiments.

Referring now to FIG. 10, an analysis system 600 for use in an inspection, analysis, and repair process (e.g., process 200 from FIG. 6) as described previously herein is illustrated, in accordance with various embodiments. The analysis system 600 comprises the processor 602, the memory 604, and the database 606 from FIG. 7. In various embodiments, the analysis system 600 is a computer-based system. In various embodiments, the system 600 is a cloud-based computing system. The present disclosure is not limited in this regard. In various embodiments, the analysis system 600 comprises a machine learning system 601 (e.g., a deep neural network (DNN), an artificial neural network (ANN), or the like). In this regard, the analysis system 600 described herein can be configured for machine learning to constantly expand experience based criteria of step 212 in process 200 via step 220 as described previously herein.

The processor 602 is configured to receive an input 603 from the inspection system 285 (e.g., via the control system 400 from FIG. 7). The input 603 can comprise, a point cloud, a three-dimensional model, two-dimensional section models, a text file of coordinates of an IBR 100 inspected in accordance with the process described further herein. In various embodiments, in response to receiving the input 603, the processor 602 is configured to generate a digital model for evaluations (e.g., as outlined in steps 210, 228 from process 200).

In various embodiments, the analysis system 600 may include a port configured to couple to a hard drive, or any other device configured to transfer data obtained from inspecting the IBR 100 in step 202 of process 200. In various embodiments, the processor 602 may be in direct electronic (e.g., wireless or wired) communication with the inspection system 285 from step 202 of process 200. In various embodiments, the processor 602 is configured to communicate with the IBR inspection system over a network, or the like. The present disclosure is not limited in this regard.

In various embodiments, the processor 602 is in communication with a user interface ("UI") 630, which includes a user device 640. The analysis system 600 can be configured for determining a repaired IBR 170, 171 having repair blend profiles 160 as shown in FIGS. 5A-E, in accordance with various embodiments. In this regard, the processor 602 of the analysis system 600 is configured to receive an input 603 (e.g., from the inspection system 285 of step 202 in process), perform various simulations and/or evaluations (e.g., in steps 210, 228), and output at the repair blend profiles 160 for respective defects 140 of the IBR 100. In various embodiments, the analysis system 600 may be configured to perform simulations based on the stack of IBRs 110 from FIG. 1B (e.g., the module level evaluations described previously herein). Each IBR in the stack of IBRs 110 can be an IBR 100 that was inspected in step 202 of process 200. In this regard, a higher fidelity analysis can be performed in step 210 or step 228 at a system level for IBR that don't meet the experience based criteria in step 212 but could meet the deterministic criteria in step 230 based on a modification of an IBR 100 in the stack of IBRs 110. In this regard, the input 603 may comprise a digital representation for each IBR 100 in a stack of IBRs 110 from FIG. 1B that have been inspected in accordance with process 200, in accordance with various embodiments.

In various embodiments, the database 606 includes an inspected IBR database 612 including available IBRs 100 for use in a stack of IBRs 110. In this regard, the analysis system 600 may be configured to mix and match IBRs 100, which were on different gas turbine engines 20 from FIG. 1A previously, based on an optimal repair process, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control (CNC) machine, an additive manufacturing machine, such as a directed energy deposition (DED) machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 606 comprises various stored data for use in the analysis system 600 as described further herein. The database 606 may include an inspected IBR database 612, a repair data database 614, a load data database 616, a test data database 618, a design data database 620, and/or a material data database 622, in accordance with various embodiments.

In various embodiments, the inspected IBR database 612 comprises a digital representation of inspected IBRs 100 with or without potential repair shapes modeled therein and received from the inspection system 285 that are awaiting repair in step 214 of the process 200. In this regard, the inspected IBR database 612 may include unrepaired IBRs 100 for use in the simulation and analysis steps of process 200 (e.g., steps 210 and/or 228). Although described herein as including the inspected IBR database 612, the present disclosure is not limited in this regard. For example, repair options may be determined for an IBR 100 individually without analysis related to other IBRs 100 in the stack of IBRs 110 from FIG. 1B, in accordance with various embodiments. Similarly, repair options may be determined for one or more blades 103 of an IBR 100 individually without analysis related to other blades 103 for the IBR 100, in accordance with various embodiments. However, by increasing the scope to the IBR 100 component level and/or to the rotor module 111 level as described further herein, more optimal repair options may be determined (e.g., based on cost, time, amount of material removed, etc.), an IBR 100 which may have had a previously unrepairable airfoil determined at a blade level may be repairable based on a component level or module level analysis, and/or blending an airfoil without a defect to offset module or component level effects (e.g., mistuning, aerodynamic capability, etc.), in accordance with various embodiments.

In various embodiments, the repair data database 614 includes previously performed repairs (e.g., blend shapes, additive repair shapes, etc.). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the IBR analysis system, the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, after the processor 602 performs the various processes disclosed further herein, the processor 602 may output at least one repair process for a respective IBR 100 to the user device (e.g., through the UI 630, directly to the user device 640, or the like). In various embodiments, the output may comprise manual instructions for a blend repair process, a computer numerical control ("CNC") machining process (e.g., blending or the like). In various embodiments, the processor 602 sends CNC machining instructions to the repair system 290 directly, and the repair system 290 repairs the IBR 100 to generate a repaired IBR 170 from FIG. 5A, in accordance with various embodiments.

In various embodiments, the database 606 includes an inspected IBR database 612 including available IBRs 100 for use in a stack of IBRs 110 (i.e., as determined in step 232 of process 200). In this regard, the analysis system 600 may be configured to mix and match IBRs 100, which were on different gas turbine engines 20 from FIG. 1A previously, based on IBRs 100 not meeting deterministic criteria at a component level, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control ("CNC") machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 606 comprises various stored data for use in the analysis system 600 as described further herein. The database 606 may include an inspected IBR database 612, a repair data database 614, a load data database 616, a test data database 618, a design data database 620, a material data database 622, and/or a quality data database 624 in accordance with various embodiments.

In various embodiments, the inspected IBR database 612 comprises a digital representation of inspected IBRs 100 received from the inspection system 285 that are awaiting repair in step 214 of process 200 or did not meet deterministic criteria in step 230 of process 200. In this regard, the inspected IBR database 612 may include unrepaired IBRs 100 for use in system level analysis of a stack of IBRs 110, in accordance with various embodiments. In various embodiments by increasing the scope to the IBR 100 component level and/or to the rotor module 111 level, inspected IBRs that would otherwise be scrapped could potentially be combined in a stack of IBRs to meet satisfy structural criteria and system level aerodynamic criteria, in accordance with various embodiments.

In various embodiments, the repair data database 614 includes previously performed repairs (e.g., blend shapes). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.) (i.e., for component level analysis in evaluation steps 210, 228, and/or for system level analysis performed in evaluation steps 210, 228 in process 200). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the analysis system 600 (e.g., steps 210, 228), the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, the quality data database 624 comprises quality data associated with various quality information/dispositions for a known defect shapes, sizes, etc. For example, quality data (e.g., an estimated remaining life, or the like), associated with a known defect can be used for a defect having a size and shape corresponding to a known defect associated with a prior quality determination. In this regard, historical quality data can be utilized by the analysis system 600 for making dispositions and determinations for an inspected IBR as described further herein, in accordance with various embodiments.

Figure 11:
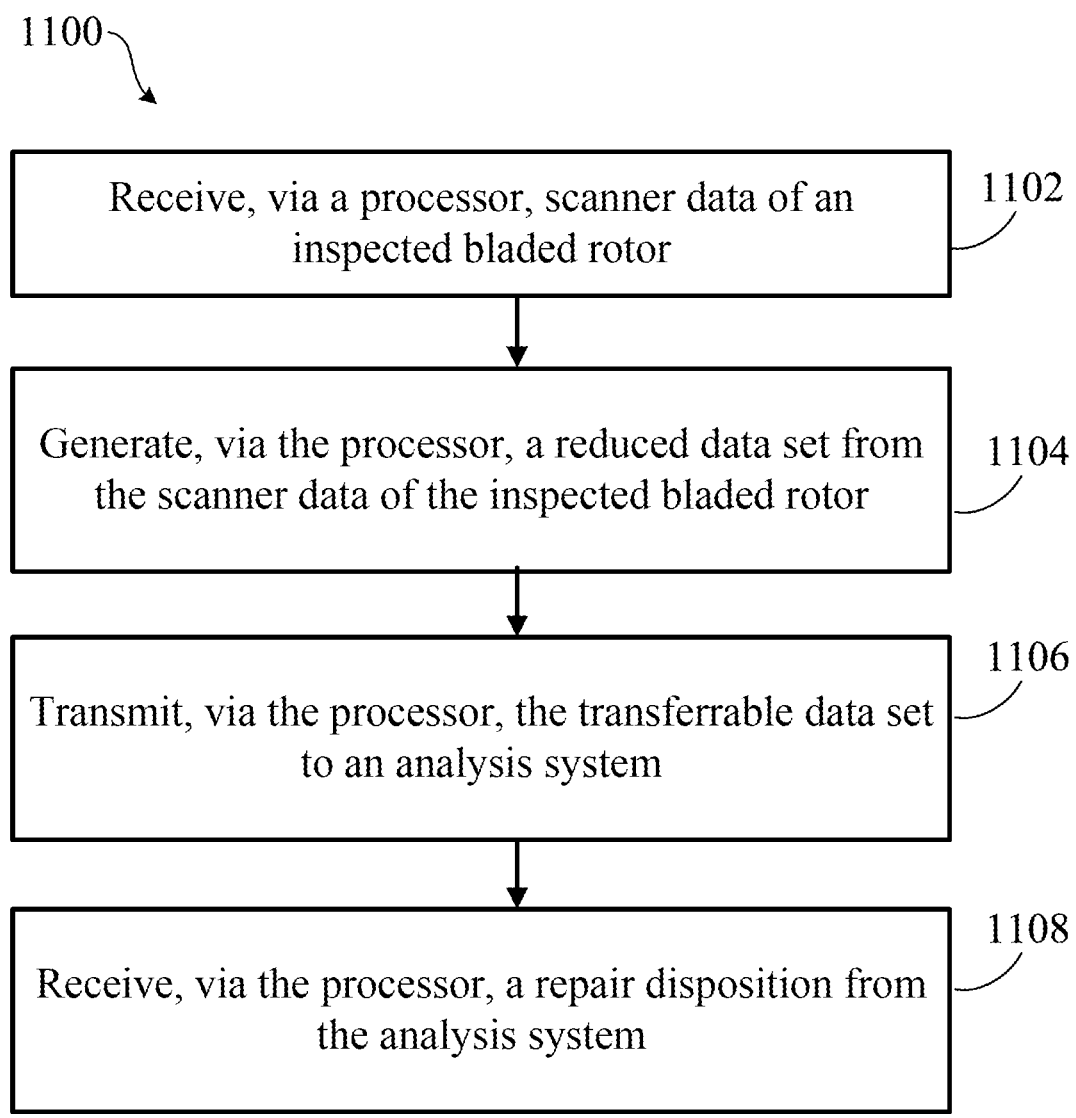
FIG. 11 illustrates a process for reducing a data file size, in accordance with various embodiments.

Referring now to FIG. 11, a process 1100 for facilitating efficient transfer of inspected bladed rotor data to an analysis system is illustrated, in accordance with various embodiments. In various embodiments, the process 1100 can be performed by an inspection system (e.g., inspection system 285 from FIGS. 7 and 8), a combined inspection and repair system (e.g., inspection system 285 and repair system 290 combined), or the like. In this regard, the process 1100 is configured for facilitating fast and/or efficient transfer of relevant inspection data from an inspection system 285 to an analysis system 600 (e.g., a cloud-based computing system or remote computing system configured for significantly greater processing power). Thus, the inspection system 285 can be installed at overhaul and/or maintenance facilities and communicate relevant inspection data with an analysis system in a remote (or cloud-based) location to perform structural and/or aerodynamic simulations to determine acceptability, and the analysis system can transmit a result back to the inspection system 285 (and/or repair system 290 as described further herein.

The process 1100 comprises receiving, via a processor (e.g., the processor 286 of FIG. 7), scanner data (e.g., from the scanner 310) of an inspected bladed rotor (e.g., IBR 100 from FIG. 7). As described previously herein, blue light scanners can be accurate up to 0.0001 inches (0.00025 cm) (i.e., have a corresponding data point in a point cloud for every 0.0001 inch of a surface). Stated another way, 10 square inches (64.5 square centimeters) of surface area can correspond to approximately 1 billion data points in a point cloud generated by a scanner 310 of inspection system 285, in accordance with various embodiments. Transferring such a large volume of data points over a network or the like to the analysis system 600 can be slow and time consuming. As such, the process 1100 further comprises, generating, via the processor, a data set from the scanner data of the inspected bladed rotor for transfer (step 1104).

The data set generated in step 1104 can be configured to greatly reduce a file size (i.e., by several orders of magnitude) compared to a file size of the scanner data alone. For example, the point cloud generated from the scanner 310 can be compared to an ideal model (i.e., a design model), of a bladed rotor and any discrepancies between the ideal model and the point cloud can be included in the data set of step 1104.

In various embodiments, with combined reference to FIG. 12A, the point cloud 1202 of a blade 1201 of an inspected IBR 1200 can be reduced to section files 1210 (i.e., files defining a perimeter of a radial cross-section of a blade 103 of an IBR 100 at various spans along a blade 103) In this regard, section files can be created at various intervals such as every 0.1 inches (0.254 cm), 0.25 inches (0.635 cm), 0.5 inches (1.27 cm), 1 inch (2.54 cm), or the like. Thus, the section files can greatly reduce a size of the data (e.g., 2500 times for 0.25 inch (0.635) intervals, 10,000 times for 1 inch (2.54 cm) intervals, etc.) and still provide a general contour of the blade 103 of the inspected IBR 100. In various embodiments, the process 1100 can generate a file size that is between 10 times and 1,000,000 times smaller relative to a file size of a point cloud generated from a scanner 310 of the inspection system 285, or between 100 times and 100,000 smaller, or between 1,000 times and 100,000 times smaller, in accordance with various embodiments. In various embodiments, as shown in FIG. 12A, a smaller interval between section files can be created at a defect location

1204. For example, section files 1210 can generally be spaced apart by an inch (2.54 cm), and then spaced apart by 0.25 inches (0.635 cm) at a defect location. Thus, more detail can be transferred to the analysis system 600 for defect locations 1204 relative to locations that are within a predetermined tolerance of an ideal IBR (e.g., an IBR corresponding to nominal design data).

In various embodiments, the processor 286 of the inspection system 285 can transform the point cloud to have the initial blend profiles (e.g., in the defect location 1204) prior to generating section files 1210 in accordance with FIG. 12A. In this regard, the processor, 286 can generate relatively smooth section files (even in a defect location 1204) that can easily be imported into a simulation (e.g., a structural simulation and/or an aerodynamic simulation) without causing any errors in the simulation. In various embodiments, the initial blend profiles can be created in accordance with step 208 of FIG. 6. In this regard, either the point cloud (or the section files) can be compared to an ideal bladed rotor (e.g., a design model bladed rotor based on nominal dimensions of the bladed rotor for manufacture) to determine if any defects meet serviceable limits prior to modeling an initial blend. In various embodiments, even defects that meet serviceable limits can still be modeled as being relatively smooth to facilitate ease of simulation (e.g., preventing errors due to sharp edges in a finite element model, or the like) in the analysis system 600 after transfer of the data file.

In various embodiments, although described as providing greater detail at defect locations, the present disclosure is not limited in this regard. For example, the reduced data set generated from the process 1100 can have even less data associated with a defect location and still be within the scope of this disclosure. For example, with reference to FIG. 12C, a data point 1220 can correspond to a defect location (e.g., a maximum defect depth, an interpolated point along an airfoil surface, or the like). Included with the data point 1220, in the reduced data set, details of the respective blend profile can be transmitted (e.g., an initial blend profile to repair the defect at the data point 1220). Thus, blend profile details can include a blend depth, a radius of curvature, a blend length, a blend width, a blend aspect ratio, etc. Any blend detail is within the scope of this disclosure. In this regard, the analysis system can take the data point 1220 with the respective defect details and modify (or transform) a digital representation of an ideal bladed rotor as described further herein.

In various embodiments, the process 1100 further comprises transmitting, via the processor, the reduced data set from the inspection system to an analysis system (e.g., analysis system 600). In this regard, the reduced data set can be small enough in size to be transferred easily and/or quickly from the inspection system 285 (e.g., through any network such as a local area network (LAN), or wide area network (WAN) such as the Internet) to the analysis system 600. Then, with high-powered computing (e.g., via a cloud-based computing system, a remote system with significant processing power), the simulations can be performed. After the are performed, a result (or disposition), can be transferred back to the inspection system (and/or repair system) (step 1108). In this regard, if the system is only an inspection system 285, the disposition can include a location of a defect, a repair blend profile for the defect, etc. If the system is an inspection system 285 and a repair system 290, the system can automatically perform the repair. In various embodiments, the disposition can include holding the inspected bladed rotor for later use (e.g., due to a defect being too large at a given point in time). In this regard, after additional learning from the processes disclosed herein, a blend profile corresponding to the inspected bladed rotor that was held may be deemed acceptable, at which time the repair blend can be performed.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A method, comprising:
   receiving an inspection data corresponding to a geometry of an inspected bladed rotor of a gas turbine engine;
   performing a baseline evaluation based on the inspection data;
   determining a plurality of candidate repair profiles for a defect of the inspected bladed rotor;
   performing an updated evaluation for a repaired bladed rotor with each of the plurality of candidate repair profiles, each of the plurality of candidate repair profiles corresponding to an expected life for the repaired bladed rotor installed on the gas turbine engine with the respective candidate repair profile;
   comparing the expected life associated with each of the plurality of candidate repair profiles to a remaining life of the gas turbine engine;
   selecting a selected candidate repair profile from the plurality of candidate repair profiles based on balancing output parameters from the updated evaluation for each of the plurality of candidate repair profiles, wherein:
      the expected life associated with a first of the plurality of candidate repair profiles is less than the expected life associated with a second of the plurality of candidate repair profiles,
      the expected life associated with the first of the plurality of candidate repair profiles is greater than the remaining life, and
      the selected candidate repair profile is the first of the plurality of candidate repair profiles; and
   performing a repair based on the selected candidate repair profile.

2. The method of claim 1, wherein the baseline evaluation and the updated evaluation include an engine performance evaluation, an engine operability evaluation, a module aerodynamic performance evaluation, and a structural evaluation.

3. The method of claim 1, wherein the plurality of candidate repair profiles includes a repair blend profile and a repair patch profile.

4. The method of claim 1, wherein the selected candidate repair profile is selected based on an impact to a second inspected bladed rotor based on an output parameter from the updated evaluation.

5. The method of claim 1, wherein the baseline evaluation and the updated evaluation includes performing a modal analysis, a static analysis, a turning and loss change analysis, and an engine performance analysis.

6. The method of claim 1, wherein the baseline evaluation includes evaluating a digital representation based on the geometry and an initial repair blend profile.

7. An article of manufacture including a tangible, non-transitory computer-readable storage medium having instructions stored thereon that, in response to execution by one or more processors, cause the one or more processors to perform operations comprising:
   receiving, by the one or more processors, a digital representation of a geometry of an inspected bladed rotor, the inspected bladed rotor being inspected after operating for a number of flight cycles on a gas turbine engine, the gas turbine engine being one of a plurality of gas turbine engines designed in accordance with a design gas turbine engine model;
   receiving, by the one or more processors, engine data from the gas turbine engine that had the inspected bladed rotor installed thereon;
   performing, by the one or more processors, a baseline evaluation of the digital representation based on the digital representation, an initial repair shape, and the engine data;
   performing, by the one or more processors, an updated evaluation for each of a plurality of candidate repair profiles for the inspected bladed rotor, each of the plurality of candidate repair profiles corresponding to an expected life for a repaired bladed rotor installed on the gas turbine engine with the respective candidate repair profile;
   comparing the expected life associated with each of the plurality of candidate repair profiles to a remaining life of the gas turbine engine;
   generating, by the one or more processors, results from the updated evaluation for each of the plurality of candidate repair profiles, wherein
      the expected life associated with a first of the plurality of candidate repair profiles is less than the expected life associated with a second of the plurality of candidate repair profiles,
      the expected life associated with the first of the plurality of candidate repair profiles is greater than the remaining life, and
      the first of the plurality of candidate repair profiles and the second of the plurality of candidate repair profiles are both indicated as acceptable in the results.

8. The article of manufacture of claim 7, wherein the operations further comprise receiving, by the one or more processors, one of the plurality of candidate repair profiles based on impacting the updated evaluation for a second inspected bladed rotor for a module level analysis.

9. The article of manufacture of claim 7, wherein the baseline evaluation and the updated evaluation include an engine performance evaluation, an engine operability evaluation, a module aerodynamic performance evaluation, and a structural evaluation.

10. The article of manufacture of claim 7, further comprising generating, by the one or more processors, shape sensitivity data to a repair shape for the inspected bladed rotor.

11. The article of manufacture of claim 7, wherein the operations further comprise determining, by the one or more processors, whether the updated evaluation for each of the plurality of candidate repair profiles meets a deterministic criteria.

12. The article of manufacture of claim 7, wherein the updated evaluation for each of the plurality of candidate repair profiles includes a module level evaluation including a plurality of inspected bladed rotors.

13. A system, comprising:
an inspection system configured to scan an inspected bladed rotor and generate a point cloud of at least a portion of the inspected bladed rotor; and
an analysis system in electronic communication with the inspection system, the analysis system comprising a tangible, non-transitory computer-readable storage medium having instructions stored thereon that, in response to execution by one or more processors, cause the one or more processors to perform operations comprising:
receive, by the one or more processors, a data set based on the point cloud;
generate, by the one or more processors, a digital representation of the inspected bladed rotor based on the data set;
perform, by the one or more processors, a baseline evaluation based on the digital representation;
perform, by the one or more processors, an updated evaluation for each of a plurality of candidate repair profiles, each of the plurality of candidate repair profiles corresponding to an expected life for a repaired bladed rotor installed on a gas turbine engine with the respective candidate repair profile;
comparing the expected life associated with each of the plurality of candidate repair profiles to a remaining life of the gas turbine engine;
generate, by the one or more processors, results from the updated evaluation for each of the plurality of candidate repair profiles; and
generate, by the one or more processors, shape sensitivity data to a repair shape for the inspected bladed rotor based on the updated evaluation, the shape sensitivity data includes the expected life associated with each of the plurality of candidate repair profiles as a function of size of each of the plurality of candidate repair profiles, wherein:
the expected life associated with a first of the plurality of candidate repair profiles is less than the expected life associated with a second of the plurality of candidate repair profiles,
the expected life associated with the first of the plurality of candidate repair profiles is greater than the remaining life, and
the first of the plurality of candidate repair profiles and the second of the plurality of candidate repair profiles are both indicated as acceptable in the results.

14. The system of claim 13, wherein the baseline evaluation and the updated evaluation include an engine performance evaluation, an engine operability evaluation, a module aerodynamic performance evaluation, and a structural evaluation.

15. The system of claim 13, wherein the operations further comprise receiving, by the one or more processors, one of the plurality of candidate repair profiles based on impacting the updated evaluation for a second inspected bladed rotor for a module level analysis.

16. The system of claim 13, wherein the operations further comprise determining, by the one or more processors, whether the updated evaluation for each of the plurality of candidate repair profiles meets a deterministic criteria.

17. The system of claim 13, wherein the updated evaluation includes an aerodynamic simulation and a structural simulation.

* * * * *